(12) United States Patent
Li et al.

(10) Patent No.: US 9,966,263 B1
(45) Date of Patent: May 8, 2018

(54) METHOD OF FABRICATING FIN STRUCTURE

(71) Applicant: United Microelectronics Corp., Hsinchu (TW)

(72) Inventors: Kun-Ju Li, Tainan (TW); Li-Chieh Hsu, Taichung (TW); Yi-Han Liao, Taichung (TW); Chun-Tsen Lu, Tainan (TW); Chih-Hsun Lin, Pingtung County (TW); Hsin-Jung Liu, Pingtung County (TW)

(73) Assignee: United Microelectronics Corp., Hsinchu (TW)

( * ) Notice: Subject to any disclaimer, the term of this patent is extended or adjusted under 35 U.S.C. 154(b) by 0 days. days.

(21) Appl. No.: 15/587,228

(22) Filed: May 4, 2017

(30) Foreign Application Priority Data

Apr. 12, 2017 (CN) .......................... 2017 1 0236563

(51) Int. Cl.
*H01L 21/033* (2006.01)

(52) U.S. Cl.
CPC ...... *H01L 21/0338* (2013.01); *H01L 21/0332* (2013.01); *H01L 21/0335* (2013.01); *H01L 21/0337* (2013.01)

(58) Field of Classification Search
CPC ............. H01L 21/0338; H01L 21/0337; H01L 21/0332; H01L 21/0335
See application file for complete search history.

(56) References Cited

U.S. PATENT DOCUMENTS 6,764,949 B2 7/2004 Bonser et al.
8,252,699 B2 8/2012 Konecni et al.
9,099,327 B2 8/2015 Haensch et al.
2012/0168402 A1* 7/2012 Wang .................. B81C 1/00063
   216/8
2015/0228480 A1 8/2015 Yin et al.

FOREIGN PATENT DOCUMENTS

JP  2009234844  * 10/2009  ............. C01B 31/02

OTHER PUBLICATIONS

JP 2009234844 English Translation of Abstract (2009).*
Peter Singer et al.,"Nanoimprint Lithography: A Contender for 32 nm?", Semiconductor International, Aug. 1, 2006, pp. 1-8.

* cited by examiner

*Primary Examiner* — Nadine Norton
*Assistant Examiner* — Mahmoud Dahimene
(74) *Attorney, Agent, or Firm* — J.C. Patents

(57) ABSTRACT

A method of fabricating fin structure is provided. A patterned catalyst layer and a patterned passivation layer extending along a first direction are formed on a substrate. The patterned passivation layer is located on the patterned catalyst layer. A carbon layer is formed on at least one side of the patterned catalyst layer and includes hollow carbon tubes arranged along the first direction. Each hollow carbon tube extends along a second direction. A removal process is performed to remove the top and a portion of the bottom of each hollow carbon tube closest to the substrate, so that remnants are left and serve as a mask layer. Two adjacent remnants form a stripe pattern extending along the second direction. The patterned passivation layer and the patterned catalyst layer are removed. The pattern of the mask layer is transferred to the substrate to form fin structures. The mask layer is removed.

16 Claims, 26 Drawing Sheets

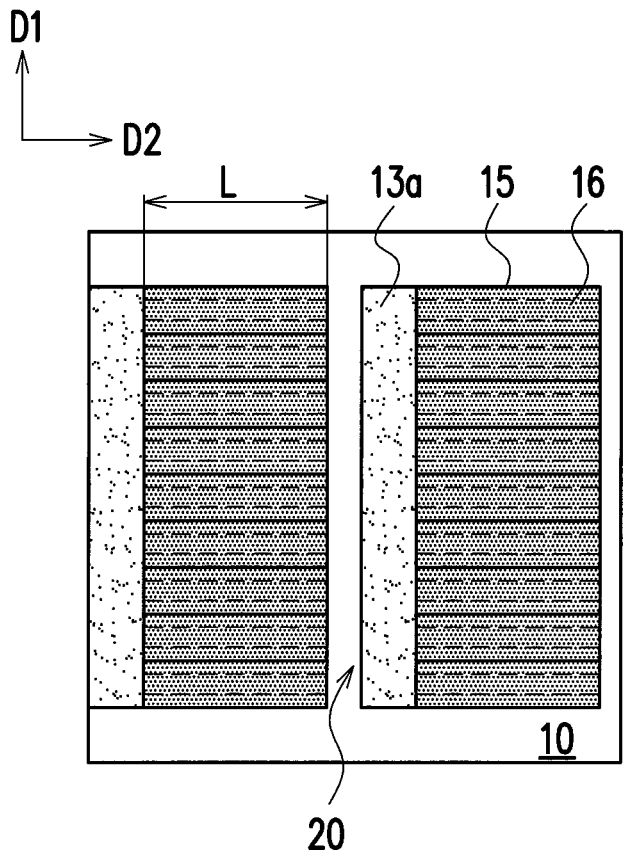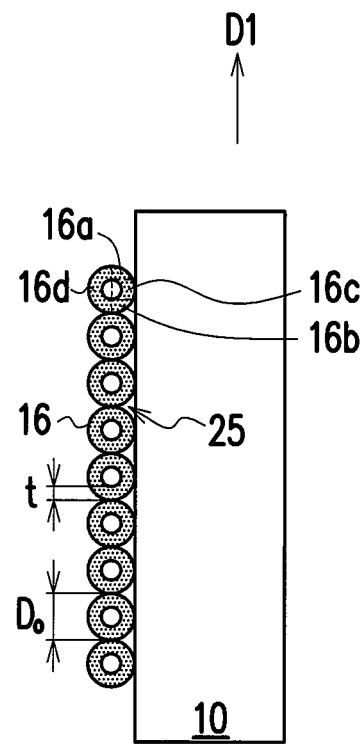
FIG. 4A    FIG. 4C
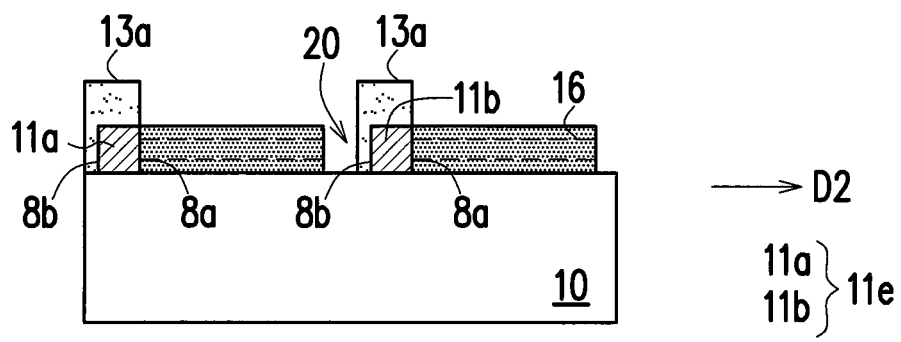
FIG. 4B

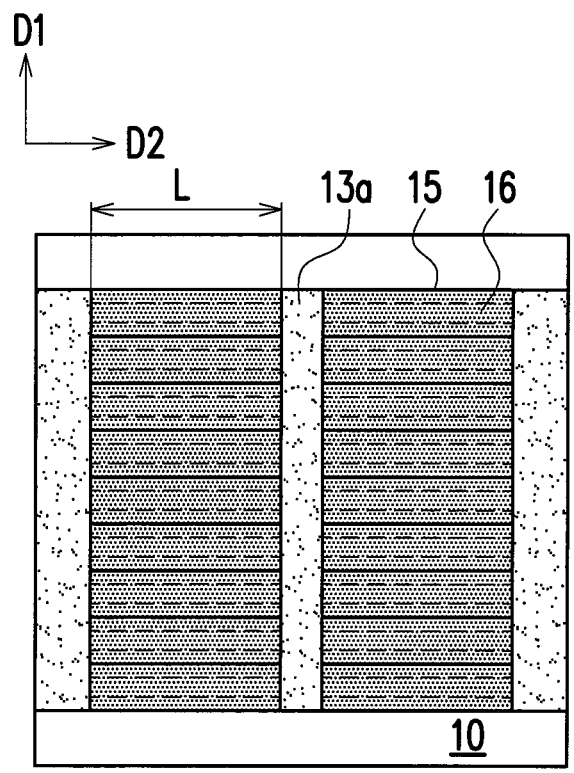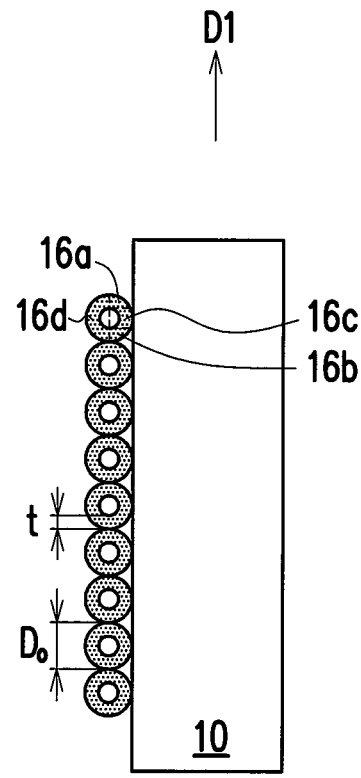
FIG. 12A  FIG. 12C
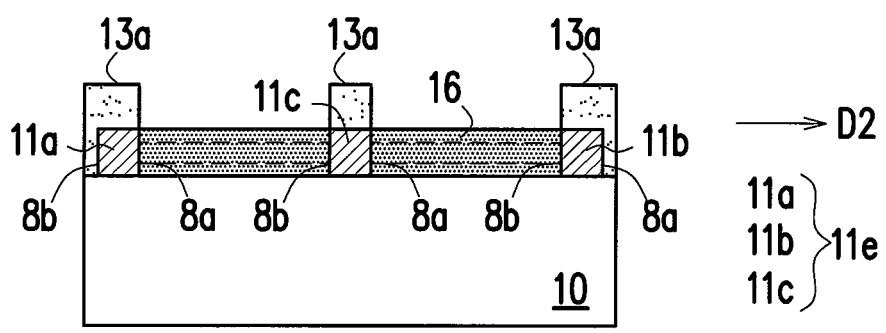
FIG. 12B

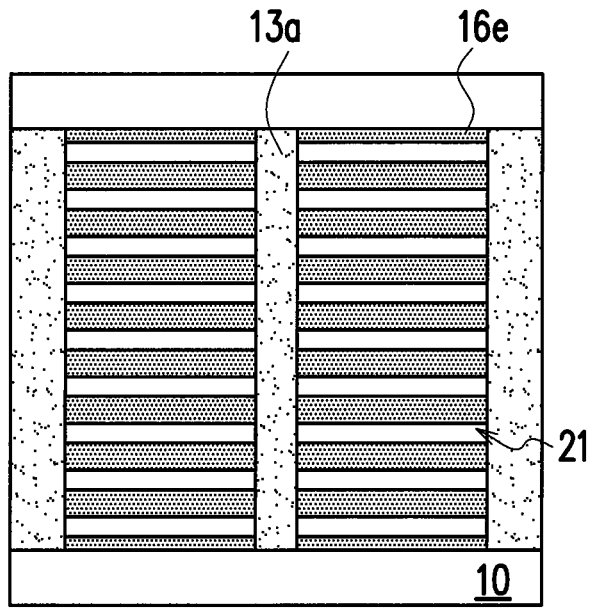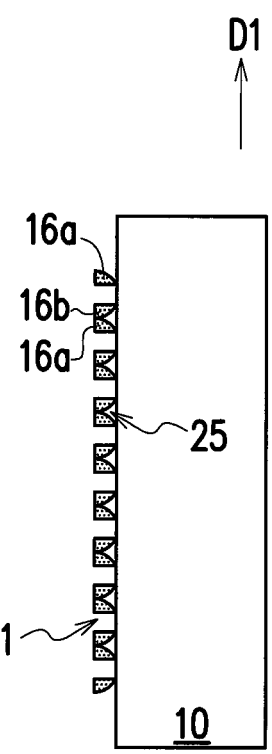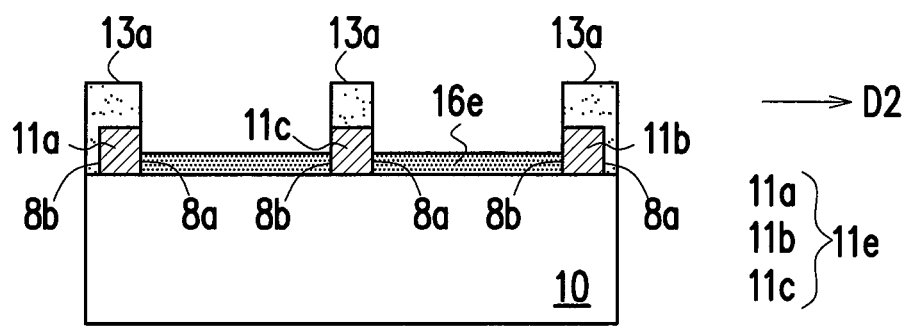
FIG. 13A   FIG. 13C
FIG. 13B

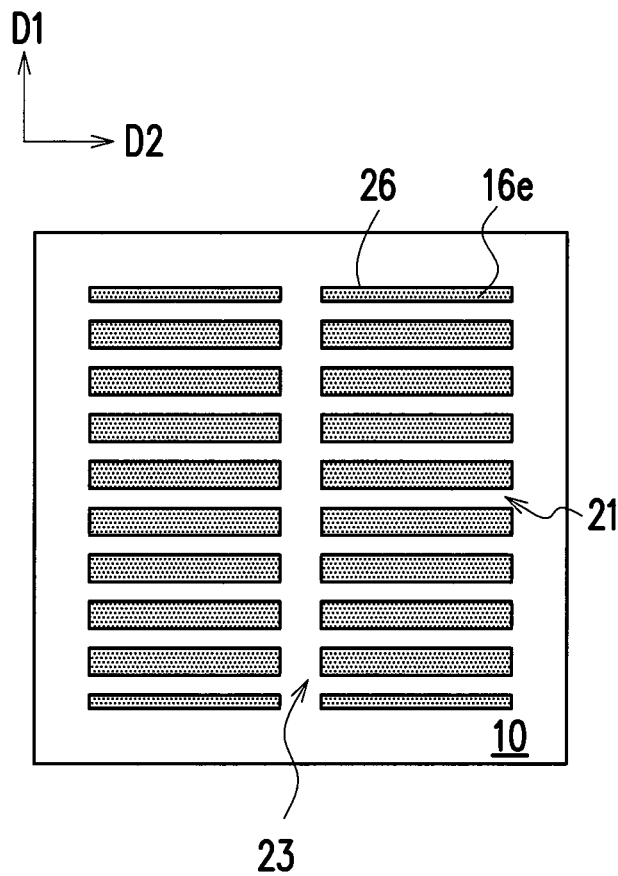
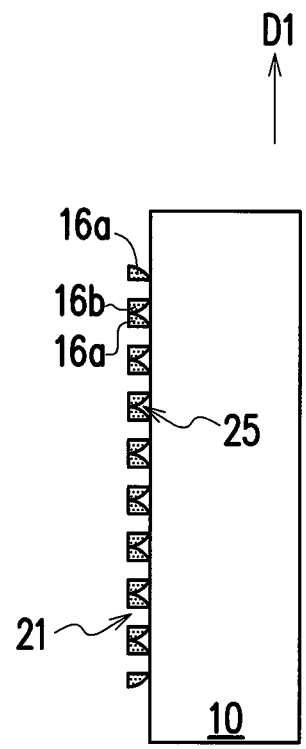
FIG. 14A    FIG. 14C
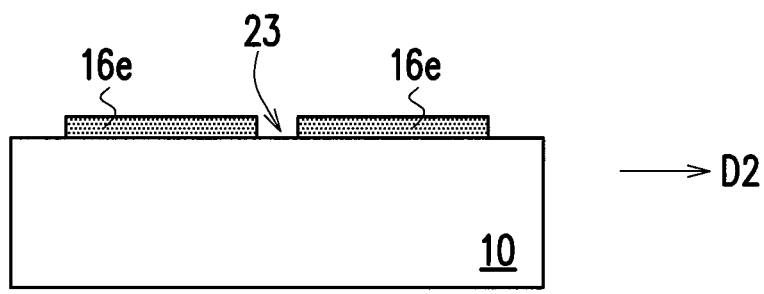
FIG. 14B

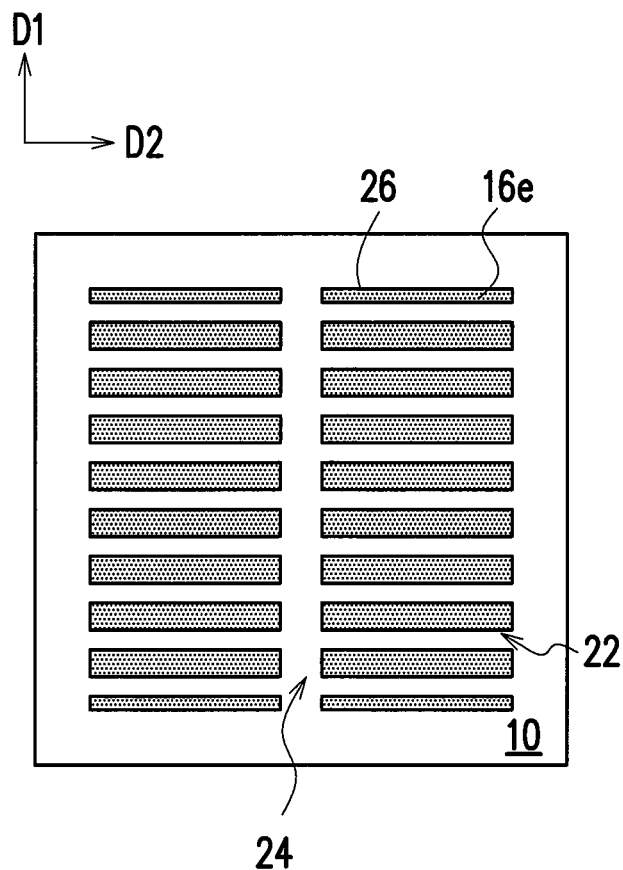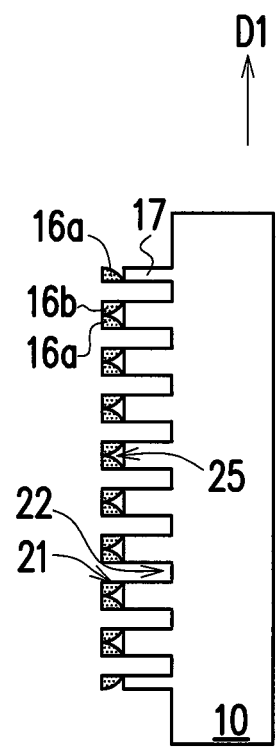
FIG. 15A  FIG. 15C
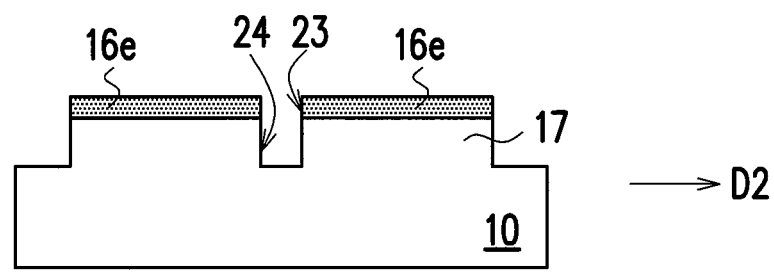
FIG. 15B

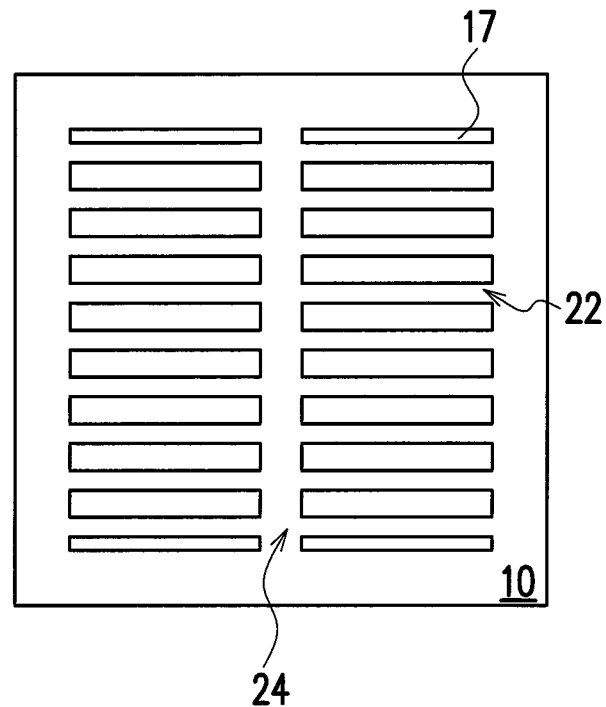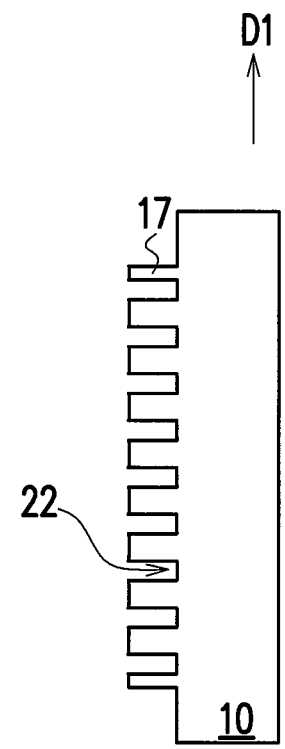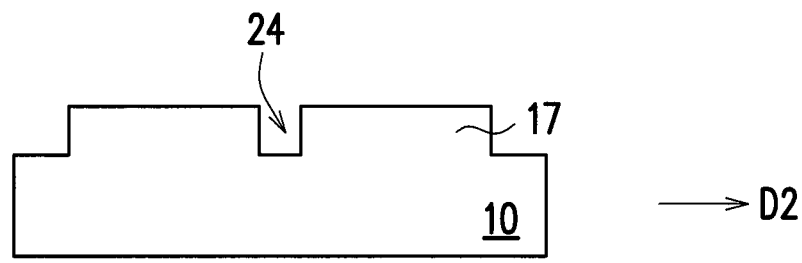
FIG. 16A
FIG. 16C
FIG. 16B

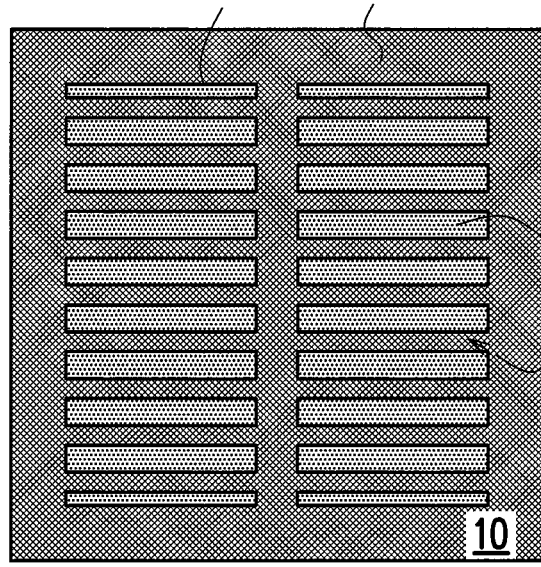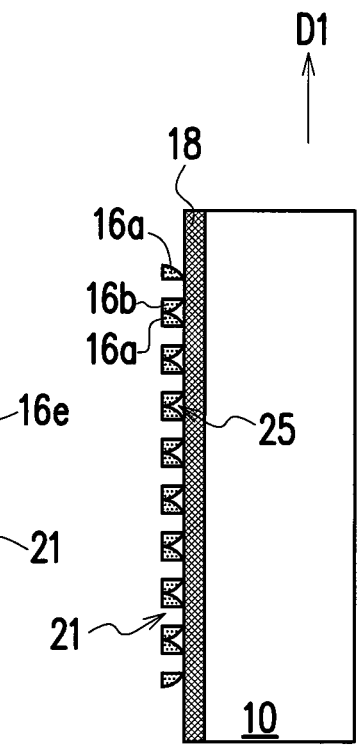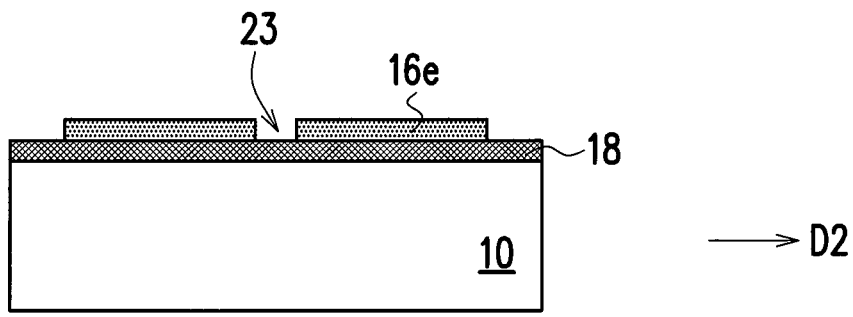
FIG. 31A
FIG. 31C
FIG. 31B

METHOD OF FABRICATING FIN STRUCTURE

CROSS-REFERENCE TO RELATED APPLICATION

This application claims the priority benefit of China application serial no. 201710236563.4, filed on Apr. 12, 2017. The entirety of the above-mentioned patent application is hereby incorporated by reference herein and made a part of this specification.

BACKGROUND OF THE INVENTION

Field of the Invention

The invention relates to a method of fabricating a fin structure.

Description of Related Art

As semiconductor components continuously decrease in sizes, three-dimensional multi-gate structures such as fin field-effect transistor (FinFET) have been developed to replace complementary metal-oxide-semiconductor (CMOS) components. The structural feature of FinFETs lies in a silicon-based fin structure that extends upwards from a surface of a semiconductor substrate in a direction perpendicular to the surface of the semiconductor substrate. According to the conventional FinFET technology, however, it is difficult to control the dimensional accuracy of the fin structures, and spaces between the fin structures are also subject to certain limitations. As semiconductor components have been developed to achieve high integration, how to accurately control the dimensions of the fin structures and reduce the spaces between the fin structures have become an issue that needs to be solved.

SUMMARY OF THE INVENTION

The invention provides a method of fabricating a fin structure to accurately control dimensions of the fin structure and obtain the fin structures with smaller spaces.

The invention provides a method of fabricating a fin structure, and the method includes a step of forming a patterned catalyst layer and a patterned passivation layer on a substrate. The patterned catalyst layer and the patterned passivation layer extend along a first direction. The patterned passivation layer is located on the patterned catalyst layer. A carbon layer is formed on at least one side of the patterned catalyst layer. The carbon layer includes a plurality of hollow carbon tubes arranged along the first direction, and each of the hollow carbon tubes extends along a second direction. A removal process is performed to remove a top of each of the hollow carbon tubes and a portion of a bottom of each of the hollow carbon tubes closest to the substrate, such that a plurality of remnants are left and serve as a mask layer. Two adjacent remnants of the remnants form a stripe pattern extending along the second direction. The patterned passivation layer and the patterned catalyst layer are removed. A pattern of the mask layer is transferred to the substrate to form a plurality of fin structures. The mask layer is removed.

In an embodiment of the invention, the patterned catalyst layer includes a first catalyst pattern and a second catalyst pattern. The carbon layer is formed between the first catalyst pattern and the second catalyst pattern.

In an embodiment of the invention, the patterned passivation layer further covers a second side of the first catalyst pattern and a second side of the second catalyst pattern, such that the hollow carbon tubes grow along the second direction from a first side of the first catalyst pattern to the second side of the second catalyst pattern.

In an embodiment of the invention, the patterned catalyst layer further includes a third catalyst pattern located between the first catalyst pattern and the second catalyst pattern. The patterned passivation layer further covers the second side of the first catalyst pattern and a first side of the second catalyst pattern.

In an embodiment of the invention, the hollow carbon tubes are connected by growing along the second direction from the first side of the first catalyst pattern and growing along a negative second direction from a second side of the third catalyst pattern, and connected by growing along the second direction from a first side of the third catalyst pattern and growing along the negative second direction from the second side of the second catalyst pattern.

In an embodiment of the invention, the method further includes a step of forming a hard mask layer on the substrate before the patterned catalyst layer is formed.

In an embodiment of the invention, the method further includes a step of patterning the hard mask layer with use of the mask layer as a mask before the pattern of the mask layer is transferred to the substrate, so as to form a patterned hard mask layer. The patterned hard mask layer is removed after the fin structures are formed.

In an embodiment of the invention, a material of the patterned hard mask layer is different from a material of the patterned passivation layer.

In an embodiment of the invention, a method of removing the patterned passivation layer includes performing an isotropic etching process, an anisotropic etching process, or a combination thereof.

In an embodiment of the invention, the hard mask layer includes a conductive material, a dielectric material, or a combination thereof.

In an embodiment of the invention, the hard mask layer includes platinum, silicon oxide, silicon nitride, titanium oxide, aluminum oxide, copper oxide, silicon oxynitride, silicon carbonitride, or silicon oxycarbonitride.

In an embodiment of the invention, the patterned passivation layer includes a conductive material, a dielectric material, or a combination thereof.

In an embodiment of the invention, the patterned passivation layer includes platinum, silicon oxide, silicon nitride, silicon oxynitride, silicon carbonitride, or silicon oxycarbonitride.

In an embodiment of the invention, the patterned catalyst layer includes metal or a metal alloy.

In an embodiment of the invention, the patterned catalyst layer includes iron, cobalt, nickel, copper, or an alloy thereof.

In an embodiment of the invention, the method further includes a step of performing an annealing process to the mask layer after the patterned passivation layer and the patterned catalyst layer are removed but before the pattern of the mask layer is transferred to the substrate.

In view of the above, according to the method of fabricating the fin structure provided herein, the fin structure is formed by patterning the substrate with use of the hollow carbon tubes as the mask layer, so as to accurately control the dimensions of the fin structure and obtain the fin structures with smaller spaces.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

FIG. 1 to FIG. 3 and FIGS. 4A/4B/4C to FIGS. 8A/8B/8C are schematic flow charts of a method of fabricating a fin structure according to a first embodiment of the invention, wherein FIG. 4A to FIG. 8A are top views of a process of fabricating the fin structure;

FIG. 4B to FIG. 8B are front views of the process of fabricating the fin structure;

FIG. 4C to FIG. 8C are side views of the process of fabricating the fin structure.

FIG. 9 to FIG. 11 and FIGS. 12A/12B/12C to FIGS. 16A/16B/16C are schematic flow charts of a method of fabricating a fin structure according to a second embodiment of the invention, wherein FIG. 12A to FIG. 16A are top views of a process of fabricating the fin structure;

FIG. 12B to FIG. 16B are front views of the process of fabricating the fin structure;

FIG. 12C to FIG. 16C are side views of the process of fabricating the fin structure.

FIG. 17 to FIG. 19 and FIGS. 20A/20B/20C to FIGS. 25A/25B/25C are schematic flow charts of a method of fabricating a fin structure according to a third embodiment of the invention, wherein FIG. 20A to FIG. 25A are top views of a process of fabricating the fin structure;

FIG. 20B to FIG. 25B are front views of the process of fabricating the fin structure;

FIG. 20C to FIG. 25C are side views of the process of fabricating the fin structure.

FIG. 26 to FIG. 28 and FIGS. 29A/29B/29C to FIGS. 34A/34B/34C are schematic flow charts of a method of fabricating a fin structure according to a fourth embodiment of the invention, wherein FIG. 29A to FIG. 34A are top views of a process of fabricating the fin structure;

FIG. 29B to FIG. 34B are front views of the process of fabricating the fin structure;

FIG. 29C to FIG. 34C are side views of the process of fabricating the fin structure.

DESCRIPTION OF THE EMBODIMENTS

Detailed embodiments of the invention are hereby provided for reference. Descriptions on the embodiments are provided in drawings. In the different embodiments provided below, same component numerals are used to show identical components in both the drawings and the descriptions. To keep the descriptions brief, descriptions of materials, forming methods, and so on are not repeated. In FIG. 4A to FIG. 8A, FIG. 12A to FIG. 16A, FIG. 20A to FIG. 25A, and FIG. 29A to FIG. 34A, a first direction D1 may be, for example, a column direction, and a second direction D2 may be, for example, a row direction. Nevertheless, the invention is not limited to the above.

Figures 8A, 8C:
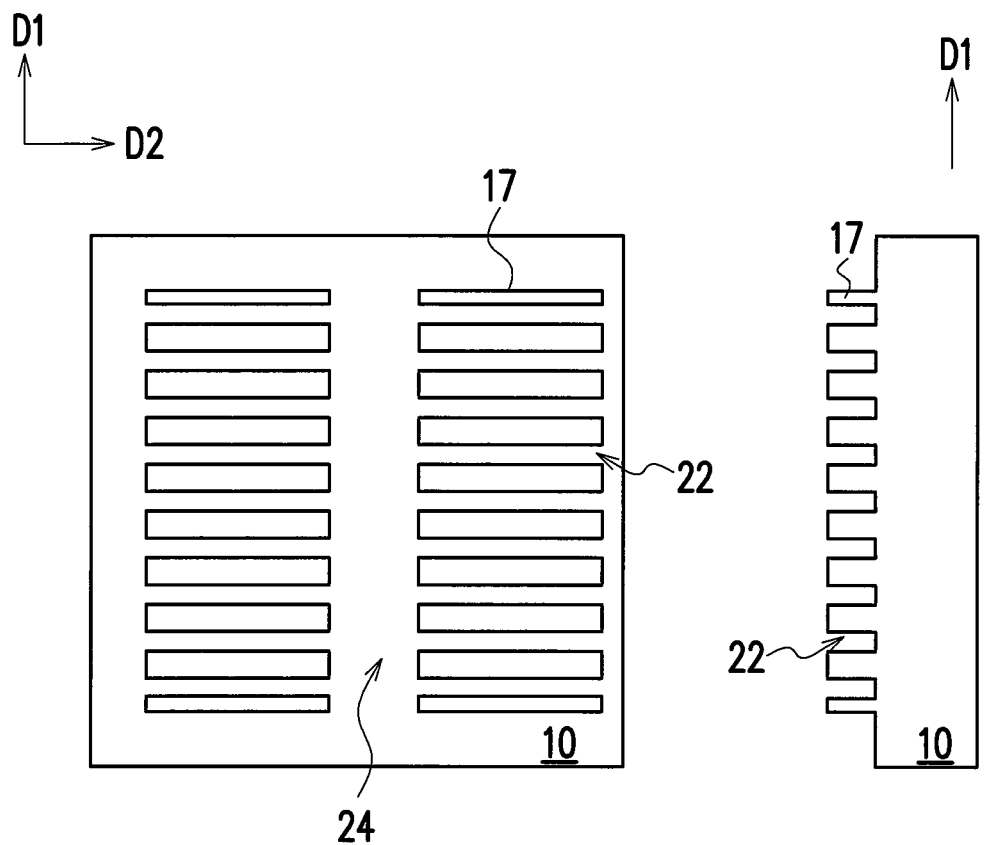
Figure 8B:
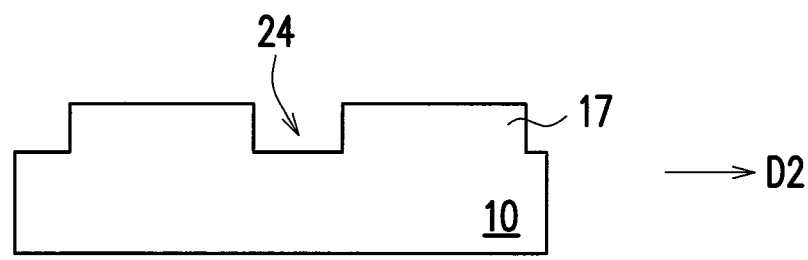

FIG. 1 to FIG. 3 and FIGS. 4A/4B/4C to FIGS. 8A/8B/8C are schematic flow charts of a method of fabricating a fin structure according to a first embodiment of the invention.

Figure 1:
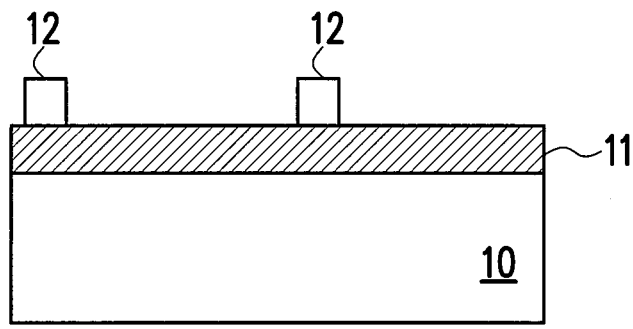

Referring to FIG. 1, a substrate 10 is provided. The substrate 10 may be a semiconductor substrate, a doped silicon substrate, an undoped silicon substrate, or a silicon-on-insulator (SOI) substrate. A dopant of the doped silicon may be a p-type dopant, an n-type dopant, or a combination thereof. A catalyst layer 11 is then formed on the substrate 10. A material of the catalyst layer 11 includes metal or a metal alloy, such as iron, cobalt, nickel, copper, or a metal alloy thereof. A method of forming the catalyst layer 11 is, for example, a chemical vapor deposition or a physical vapor deposition. Afterwards, a patterned mask layer 12 is formed on the catalyst layer 11. The patterned mask layer 12 exposes a portion of the catalyst layer 11. A material of the patterned mask layer 12 is, for example, photoresist. The patterned mask layer 12 is formed by, for example, forming a photoresist layer on the catalyst layer 11 and then performing an exposure process and a development process on the photoresist layer.

Figure 2:
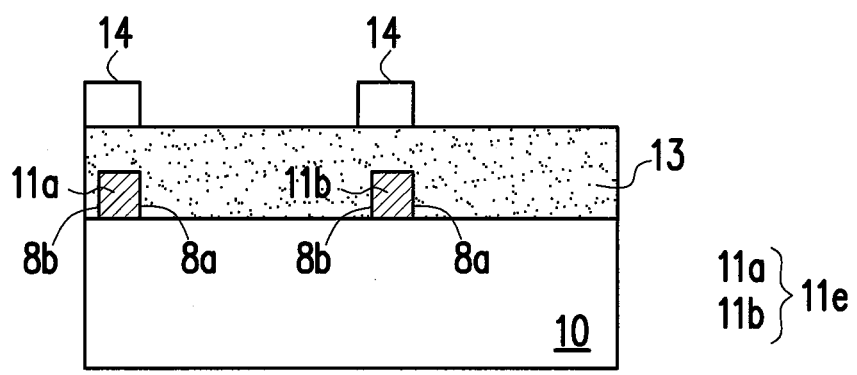

Referring to FIG. 1 and FIG. 2, the catalyst layer 11 is patterned through etching with use of the patterned mask layer 12 as a mask, for example, so as to form a patterned catalyst layer 11e. The patterned catalyst layer 11e includes a first catalyst pattern 11a and a second catalyst pattern 11b. The first catalyst pattern 11a and the second catalyst pattern 11b both have a first side 8a and a second side 8b. The first side 8a of the first catalyst pattern 11a is adjacent to the second side 8b of the second catalyst pattern 11b. The patterned mask layer 12 is removed afterwards.

A passivation layer 13 is formed on the substrate 10 to cover the patterned catalyst layer 11e and the substrate 10. A material of the passivation layer 13 includes a conductive material, a dielectric material, or a combination thereof. The conductive material is, for example, metal, a metal alloy, metal oxide, or a combination thereof. The dielectric material is, for example, oxide, nitride, oxynitride, carbonitride, or a combination thereof. A material of the passivation layer 13 is, for example, platinum, silicon oxide, silicon nitride, silicon oxynitride, silicon carbonitride, silicon oxycarbonitride, or a combination thereof. A method of forming the passivation layer 13 is, for example, a physical vapor deposition, a chemical vapor deposition, or a spin coating.

A patterned mask layer 14 is formed on the passivation layer 13. A material of the patterned mask layer 14 is, for example, photoresist. The patterned mask layer 14 is formed by, for example, forming a photoresist layer on the passivation layer 13 and then performing an exposure process and a development process on the photoresist layer. The patterned mask layer 14 covers a portion of the passivation layer 13 above the patterned catalyst layer 11e. An area of the portion of the passivation layer 13 covered by the patterned mask layer 14 is greater than an area of the patterned catalyst layer 11e.

Figure 3:
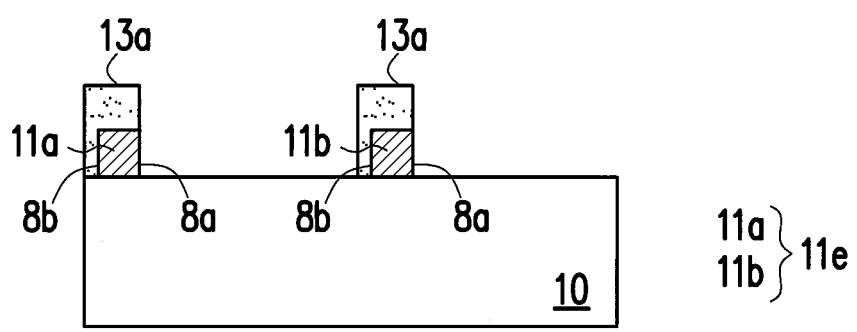
Figures 5A, 5C:
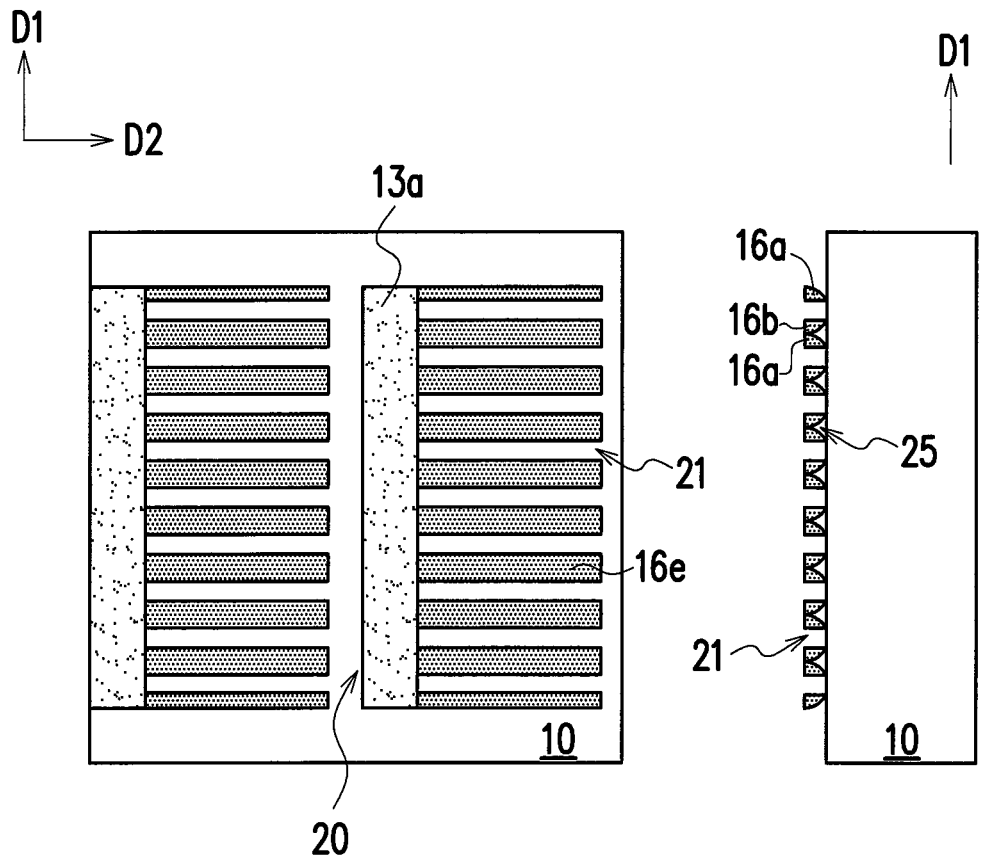
Figure 5B:
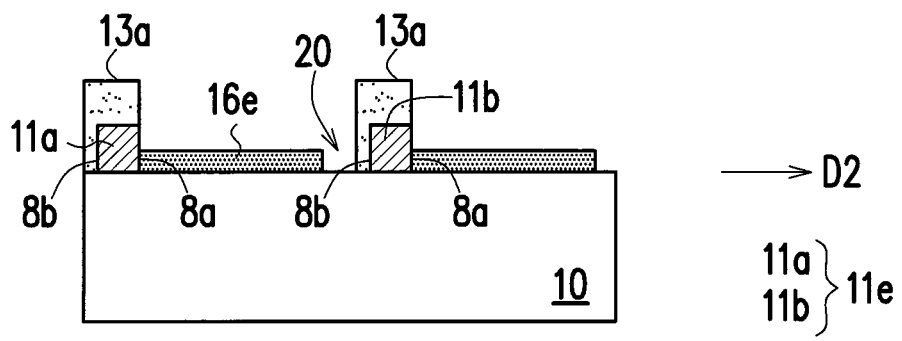
Figures 6A, 6C:
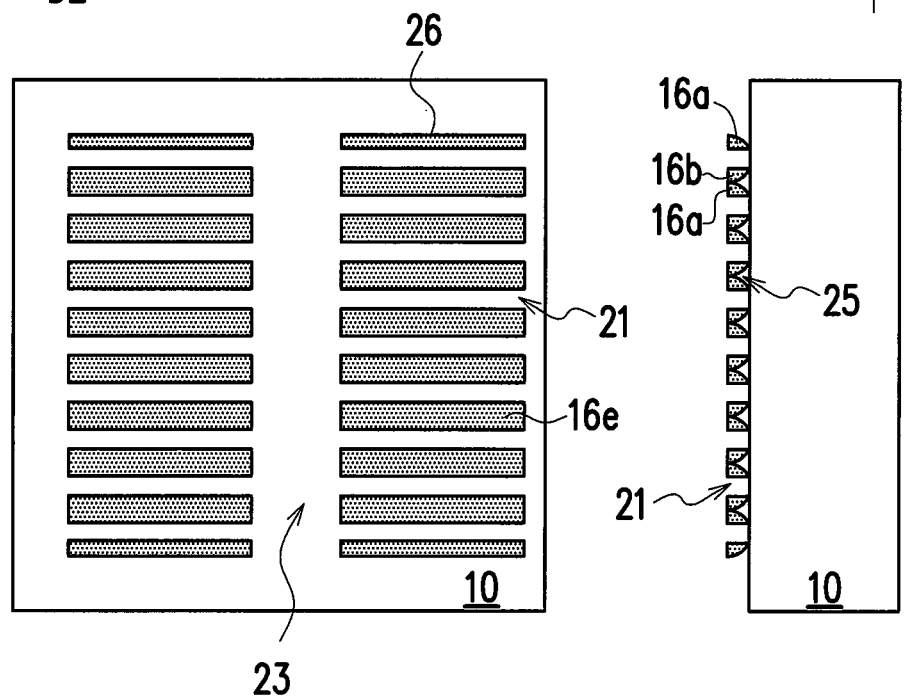
Figure 6B:
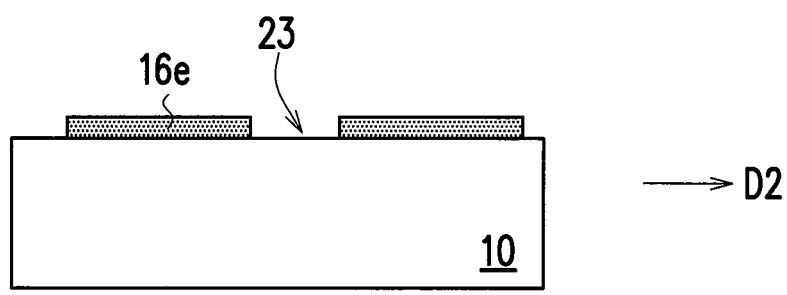
Figures 7A, 7C:
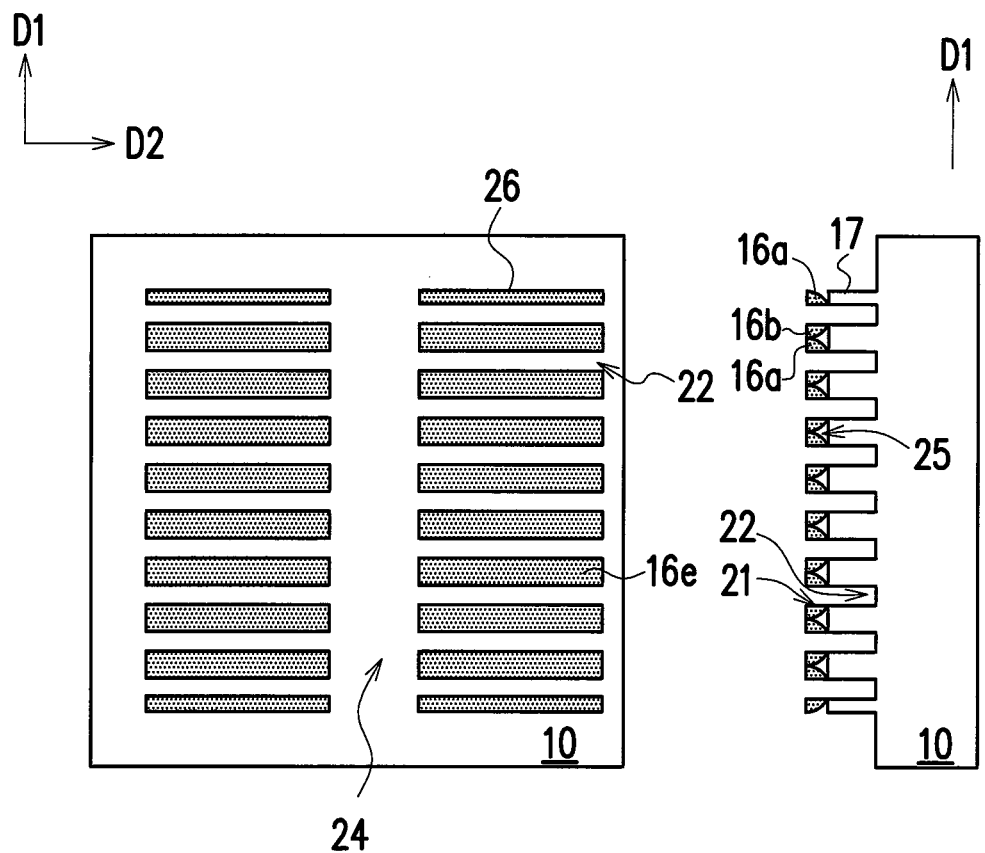
Figure 7B:
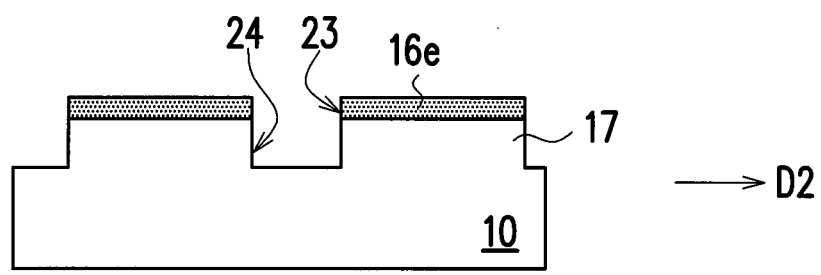

Referring to FIG. 2 and FIG. 3, the passivation layer 13 is patterned by etching with use of the patterned mask layer 14 as a mask, for instance, so as to form a patterned passivation layer 13a. The patterned passivation layer 13a covers surfaces and the second sides 8b of the first catalyst pattern 11a and the second catalyst pattern 11b and exposes the first sides 8a of the first catalyst pattern 11a and the second catalyst pattern 11b. The patterned mask layer 14 is then removed.

Referring to FIG. 4A to FIG. 4C, the patterned catalyst layer 11e and the patterned passivation layer 13 extend along the first direction D1. The second sides 8b of the first catalyst pattern 11a and the second catalyst pattern 11b of the patterned catalyst layer 11e are both covered by the patterned passivation layer 13a. A carbon layer 15 is formed on the exposed first sides 8a of the first catalyst pattern 11a and the second catalyst pattern 11b. In some embodiments, the carbon layer 15 is connected to the first side 8a of the first catalyst pattern 11a and separated from the second side 8b of the second catalyst pattern 11b by a space 20. In some other embodiments, the carbon layer 15 is connected to the second side 8b of the second catalyst pattern 11b without any space between the carbon layer 150 and the second side 8b. In some embodiments, the carbon layer 15 is attached to the substrate 10 due to a van der waal's force between the carbon layer 15 and the substrate 10.

In some embodiments of the invention, the carbon layer 15 includes a plurality of hollow carbon tubes 16. In some embodiments, the hollow carbon tubes 16 are cylindrical carbon nanotubes (CNT) and are formed by, for example, a chemical vapor deposition. The chemical vapor deposition includes a low pressure chemical vapor deposition (LPCVD. In some exemplary embodiments, the hollow carbon tubes 16 are formed by self-aligning and growing along a second direction D2 from the first side 8a of the first catalyst pattern 11a to the second side 8b of the second catalyst pattern 11b through the LPCVD with use of a gas mixture of acetylene ($C_2H_2$) and argon (Ar) under the circumstances where a pressure is lower than 500 torr and a temperature is lower than 500° C. The hollow carbon tubes 16 extend along the second direction D2 and are arranged along the first direction D1. In some embodiments, the hollow carbon tubes 16 are arranged in an array. A space 25 exists between two adjacent hollow carbon tubes 16 and the substrate 10. A cross-section of the space 25 is, for example, in a shape of a triangle, a fish tail, an inverted T, or a hanger. In some embodiments, an outer diameter $D_o$ of the hollow carbon tubes 16 ranges from 1 nm to 15 nm, a wall thickness t of the hollow carbon tubes 16 ranges from 0.3 nm to 5 nm, and a length L of the hollow carbon tubes 16 ranges from 10 nm to 100 nm.

Referring to FIG. 4A to 4C, FIG. 5A to 5C, a removal process is performed to remove a top 16d and a portion 16c of a bottom of each of the hollow carbon tubes 16 closest to the substrate 10, and remnants 16a and 16b are left. The removal process is performed through carrying out a proper etching process, for instance. Two remnants 16a and 16b are left in each of the hollow carbon tubes 16 after the etching process is performed on the hollow carbon tubes 16. An opening 21 is formed between the remnants 16a and 16b left in the same hollow carbon tube 16, and a portion of the substrate 10 is exposed. In some embodiments, the cross-sections of remnants 16a and 16b are in a shape of a fan, a triangle, or a combination thereof. Surfaces of each of two remnants 16a and 16b in the same hollow carbon tube 16 are substantially same level and connected, and thus a stripe pattern 16e extending along a second direction D2 is formed. In other words, the remnant 16a left in each of the hollow carbon tubes 16 is connected to the remnant 16b left in an adjacent hollow carbon tube 16, and thus the stripe pattern 16e is formed. The remnant 16b left in each of the hollow carbon tubes 16 is connected to the remnant 16a left in an adjacent hollow carbon tube 16, and thus the stripe pattern 16e is formed. Since the remnant 16a and the remnant 16b respectively located on two ends do not have the adjacent remnant 16b and the adjacent remnant 16a, the remnants 16a and 16b located on the two ends respectively form an independent stripe pattern 16e extending along the second direction D2. In other words, the stripe patterns 16e formed by the remnants 16a or/and the remnants 16b extend along the second direction D2 and are arranged along the first direction D1, and an opening 21 exists between two adjacent stripe patterns 16e in the same row. In some embodiments of the invention, a plurality of stripe patterns 16e form a mask layer 26.

Referring to FIG. 5A to FIG. 5C and FIG. 6A to FIG. 6C, the patterned passivation layer 13a, the first catalyst pattern 11a, and the second catalyst pattern 11b are removed to form an opening 23 between the remnants 16a/16b in two adjacent columns, and a portion of the substrate 10 is exposed. A method of said removal is, for example, an etching process. The etching process includes an isotropic etching process, an anisotropic etching process, or a combination thereof. The mask layer 26 has the opening 21 and the opening 23 that expose a portion of the substrate 10.

An annealing process is performed on the mask layer 26 to enhance properties of the mask layer 26, such as bond energy of a C—C bond in the mask layer 26 and a C—Si van der waal's force existing between the mask layer 26 and the substrate 10. The annealing process includes a rapid temperature process (RTP).

Referring to FIG. 7A to FIG. 7C and FIG. 8A to FIG. 8C, a portion of the substrate 10 exposed by the opening 21 located between two adjacent stripe patterns 16e in the same column is removed by etching with use of the mask layer 26 as a mask, for example, so as to form a trench 22 in the substrate 10. The substrate 10 exposed by the opening 23 located between two columns of the stripe patterns 16 is simultaneously removed to form a trench 24 in the substrate 10. A fin structure 17 is formed on the substrate 10 located between two adjacent trenches 22 in the same column. The fin structures 17 extend along the second direction D2 and are arranged along the first direction D1. Two adjacent columns of the fin structures 17 are separated by the trench 24. The mask layer 26 is then removed through etching, for instance.

FIG. 9 to FIG. 11 and FIGS. 12A/12B/12C to FIGS. 16A/16B/16C are schematic flow charts of a method of fabricating a fin structure according to a second embodiment of the invention. A difference between this embodiment and the first embodiment of the invention lies in that a patterned catalyst layer 11e provided in the present embodiment has three catalyst patterns (11a/11b/11c). Detailed descriptions are as follows.

Figure 9:
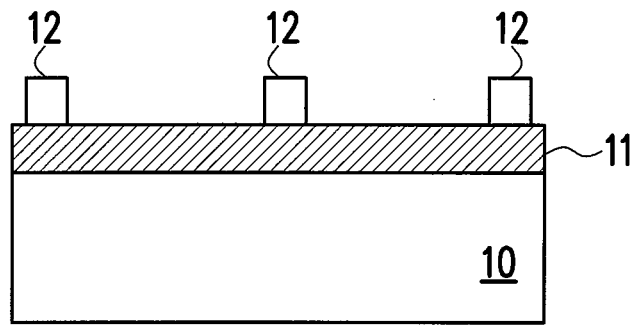
Figure 10:
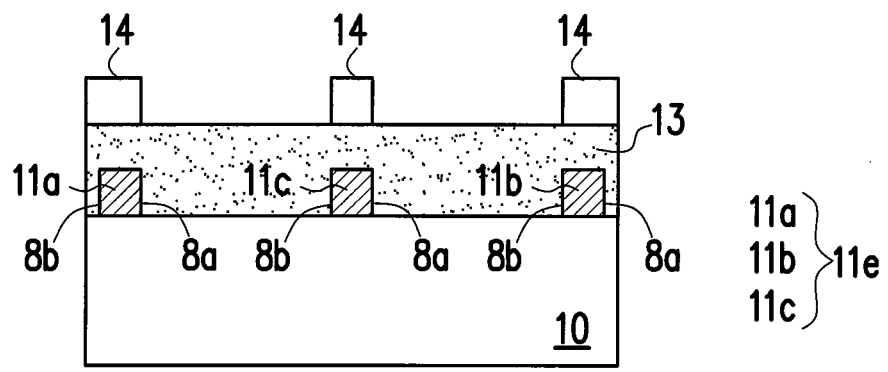

Referring to FIG. 9 and FIG. 10, a catalyst layer 11 and a patterned mask layer 12 are formed on a substrate 10. The catalyst layer 11 is patterned by using the patterned mask layer 12 as a mask to form a patterned catalyst layer 11e. The patterned catalyst layer 11e includes a first catalyst pattern 11a, a second catalyst pattern 11b, and a third catalyst pattern 11c. The third catalyst pattern 11c is located between the first catalyst pattern 11a and the second catalyst pattern 11b. Each of the catalyst patterns 11a, 11b, and 11c has a first side 8a and a second side 8b. The patterned mask layer 12 is then removed.

Figure 11:
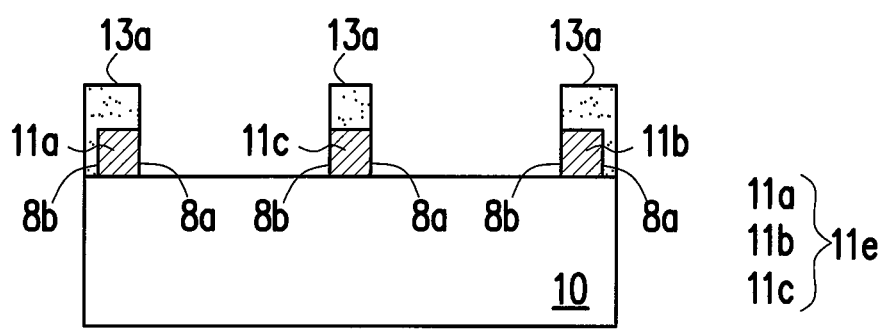

Referring to FIG. 10 and FIG. 11, a passivation layer 13 is formed to cover the patterned catalyst layer 11e and the substrate 10. A patterned mask layer 14 is then formed on the passivation layer 13. The passivation layer 13 is patterned by using the patterned mask layer 14 as a mask to form a patterned passivation layer 13a. The patterned mask layer 14 is removed afterwards.

Referring to FIG. 11, the patterned passivation layer 13a covers surfaces of the first catalyst pattern 11a, the second catalyst pattern 11b, and the third catalyst pattern 11c. The patterned passivation layer 13a also covers the second side 8b of the first catalyst pattern 11a and the first side 8a of the second catalyst pattern 11b. The first side 8a of the first catalyst pattern 11a, the second side 8b of the second catalyst pattern 11b, and the first side 8a and the second side 8b of the third catalyst pattern 11c are exposed.

Referring to FIG. 12A to FIG. 12C, a carbon layer 15 is formed between the first catalyst pattern 11a and the third catalyst pattern 11c and between the second catalyst pattern 11b and the third catalyst pattern 11c. The carbon layer 15 includes a plurality of hollow carbon tubes 16. The carbon layer 15 is connected to the first side 8a of the first catalyst pattern 11a and the second side 8b of the third catalyst pattern 11c. The carbon layer 15 is also connected to the first side 8a of the third catalyst pattern 11c and the second side 8b of the second catalyst pattern 11b.

Specifically, in this embodiment of the invention, the hollow carbon tubes 16 located between the first catalyst pattern 11a and the third catalyst pattern 11c are connected by growing along the second direction D2 from the first side 8a of the first catalyst pattern 11a and growing along a negative second direction D2 from the second side 8b of the third catalyst pattern 11c. The hollow carbon tubes 16 located between the third catalyst pattern 11c and the second catalyst pattern 11b are connected by growing along the second direction D2 from the first side 8a of the third catalyst pattern 11c and growing along the negative second direction D2 from the second side 8b of the second catalyst pattern 11b.

A distance between the first catalyst pattern 11a and the third catalyst pattern 11c and/or a distance between the third catalyst pattern 11c and the second catalyst pattern 11b may be adjusted according to practical demands. For example, in some other embodiments where said distances are greater than those in the present embodiment, the hollow carbon tubes 16 located between the first catalyst pattern 11a and the third catalyst pattern 11c grow along the second direction D2 from the first side 8a of the first catalyst pattern 11a and grows along the negative second direction D2 from the second side 8b of the third catalyst pattern 11c. However, the hollow carbon tubes 16 are not connected, and spaces exist between the hollow carbon tubes 16. The hollow carbon tubes 16 located between the third catalyst pattern 11c and the second catalyst pattern 11b grow along the second direction D2 from the first side 8a of the third catalyst pattern 11c and grow along the negative second direction D2 from the second side 8b of the second catalyst pattern 11b. The hollow carbon tubes 16 are not connected, and other spaces exist between the hollow carbon tubes.

A process similar to the process described in the first embodiment is then performed to form a fin structure 17.

Referring to FIG. 13A to FIG. 13c and FIG. 14A to FIG. 14C, atop 16d and a portion 16c of a bottom of each of the hollow carbon tubes 16 closest to the substrate 10 are removed, and a plurality of remnants 16a and 16b are left. An opening 21 exists between two remnants 16a and 16b left in the same hollow carbon tube 16. In some embodiments of the invention, shapes of each of the remnants 16a/16b, arrangements of the remnants 16a/16b and adjacent remnants, and arrangements of the stripe pattern 16e formed by the remnants are substantially the same as those provided in the first embodiment. To keep the descriptions brief, no further explanation will be provided hereinafter.

Referring to FIG. 14A to FIG. 14C, the patterned passivation layer 13a and the patterned catalyst layer 11e are removed to form an opening 23 between two adjacent columns of remnants 16a/16b. A plurality of remnants 16a or/and 16b constitute a stripe pattern 16e. A plurality of stripe patterns 16e constitute a mask layer 26. The mask layer 26 has an opening 21 and an opening 23 that expose a portion of the substrate 10. An annealing process is performed to the mask layer 26 to enhance properties of the mask layer 26.

Referring to FIG. 15A to FIG. 15C and FIG. 16A to FIG. 16C, the portion of the substrate 10 exposed by the opening 21 and the opening 23 are removed by using the mask layer 26 as a mask, so as to respectively form trenches 22 and 24 in the substrate 10. A fin structure 17 is formed on the substrate 10 located between two adjacent trenches 22 in the same column. The fin structures 17 in two adjacent columns are separated by a trench 24. The mask layer 26 is removed afterwards.

Figures 25A, 25C:
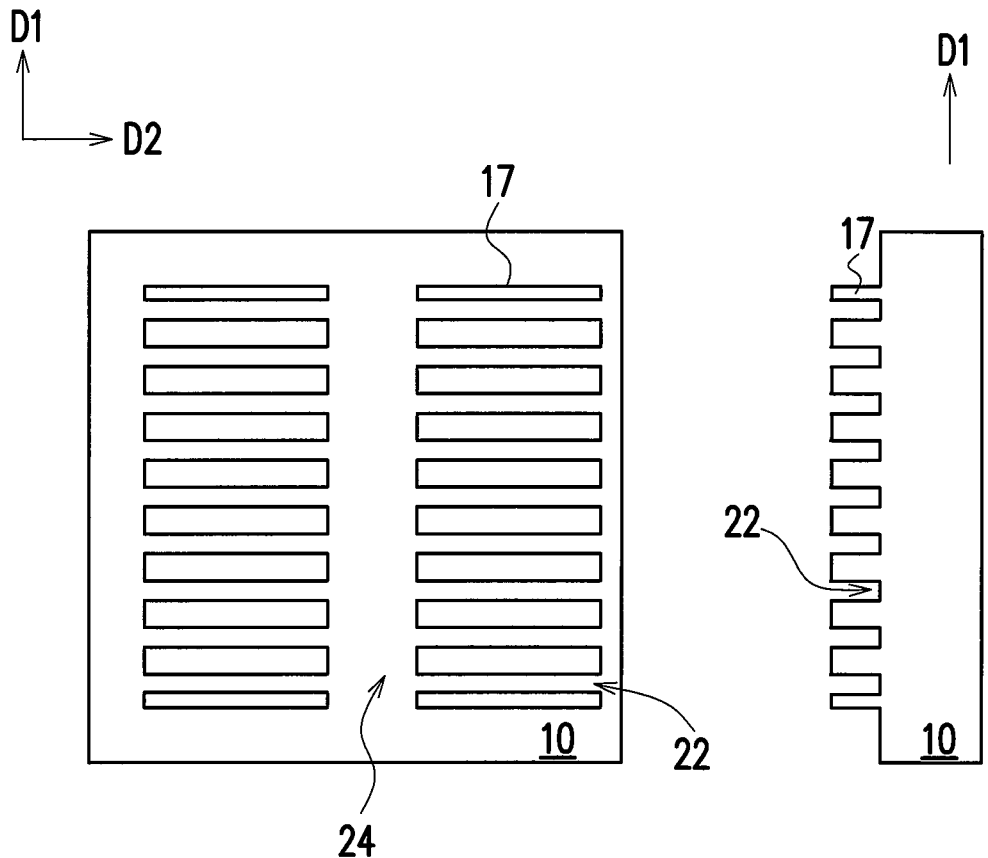
Figure 25B:
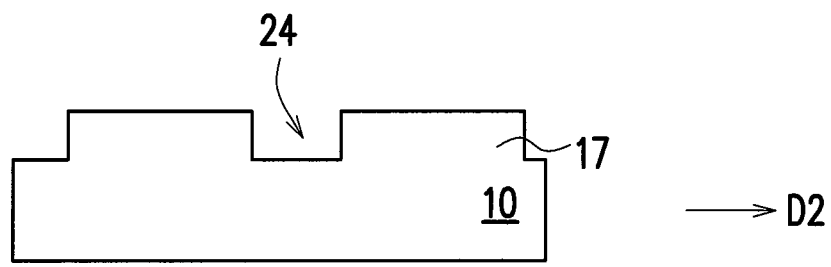

FIG. 17 to FIG. 19 and FIGS. 20A/20B/20C to FIGS. 25A/25B/25C are schematic flow charts of a method of fabricating a fin structure according to a third embodiment of the invention. This embodiment is similar to the first embodiment. A difference between this embodiment and the first embodiment lies in that a hard mask layer 18 is formed before the catalyst layer 11 is formed in this embodiment. Subsequent processes are then performed, and detailed descriptions are as follows.

Figure 17:
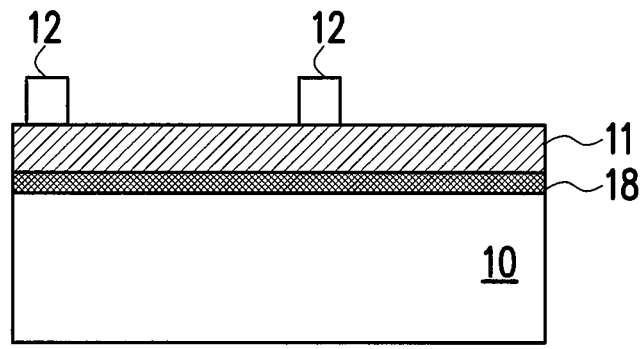

Referring to FIG. 17, the hard mask layer 18 is formed on the substrate 10. A material of the hard mask layer 18 includes a conductive material, a dielectric material, or a combination thereof. The conductive material is, for example, metal, a metal alloy, a metal oxide, or a combination thereof. The dielectric material is, for example, oxide, nitride, oxynitride, carbonitride, or a combination thereof. The hard mask layer 18 is, for example, platinum, titanium oxide, aluminum oxide, copper oxide, silicon oxide, silicon nitride, silicon oxynitride, silicon carbonitride, silicon oxycarbonitride, or a combination thereof. A method of forming the hard mask layer 18 is, for example, a chemical vapor deposition. A catalyst layer 11 and a patterned mask layer 12 are then formed on the hard mask layer 18.

Figure 18:
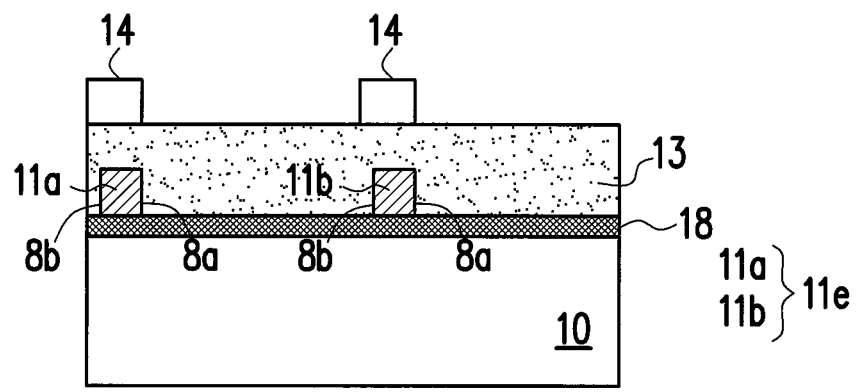

Referring to FIG. 17 and FIG. 18, the catalyst layer 11 is patterned by using the patterned mask layer 12 as a mask, so as to form a patterned catalyst layer 11e. The patterned catalyst layer 11e includes a first catalyst pattern 11a and a second catalyst pattern 11b. The patterned mask layer 12 is removed afterwards.

A passivation layer 13 is formed on the substrate 10 to cover the patterned catalyst layer 11e and the substrate 10. In some embodiments of the invention, a material of a passivation layer 13 is different from a material of a hard mask layer 18. In some other embodiments of the invention, a material of a passivation layer 13 is identical to a material of a hard mask layer 18. A patterned mask layer 14 is then formed on the passivation layer 13.

Figure 19:
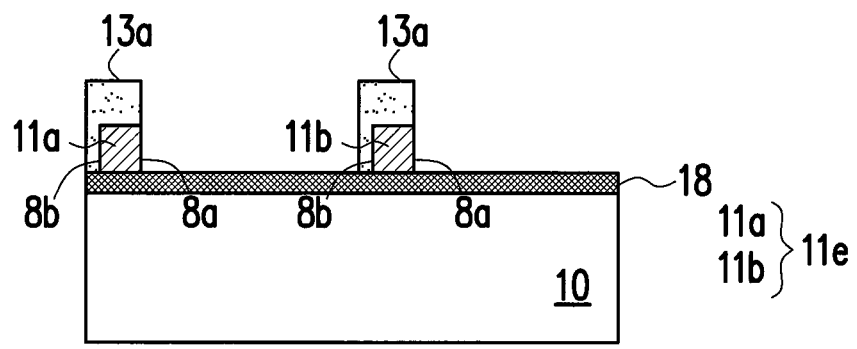

Referring to FIG. 18 and FIG. 19, the passivation layer 13 is patterned by using the patterned mask layer 14 as a mask to form a patterned passivation layer 13a. The patterned passivation layer 13a covers the surfaces and the second sides 8b of the first catalyst pattern 11a and the second catalyst pattern 11b and exposes the first sides 8a of the first catalyst pattern 11a and the second catalyst pattern 11b. Afterwards, the patterned mask layer 14 is removed.

Figure 20A:
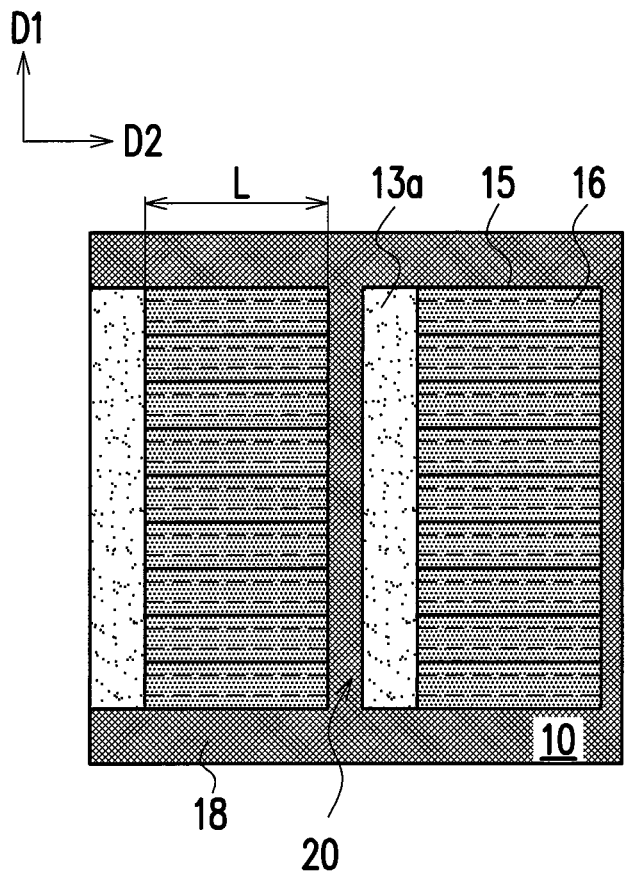
Figure 20C:
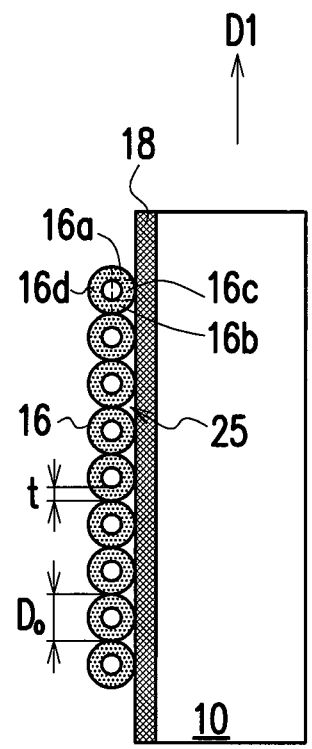
Figure 20B:
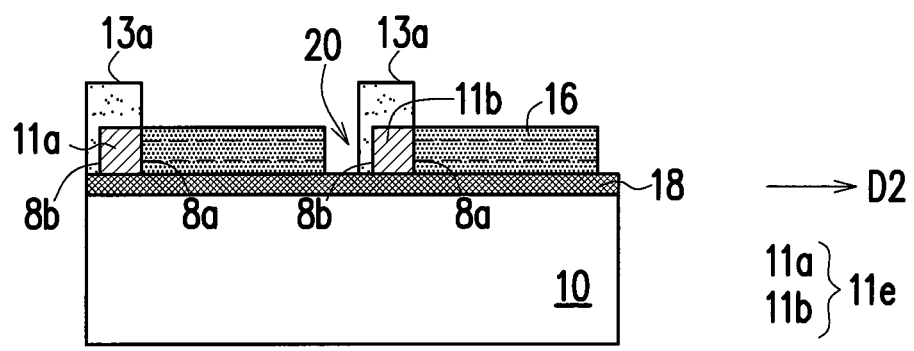
Figure 21A:
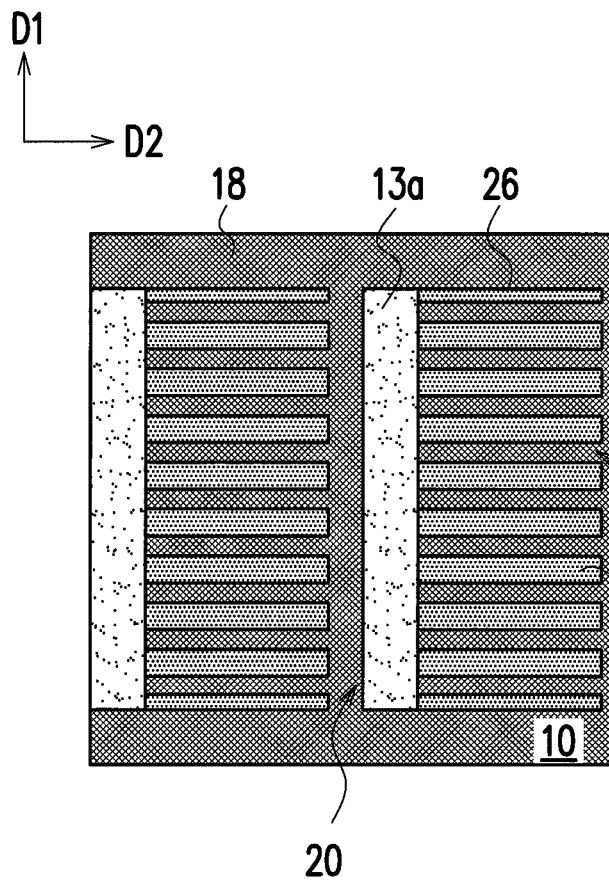
Figure 21C:
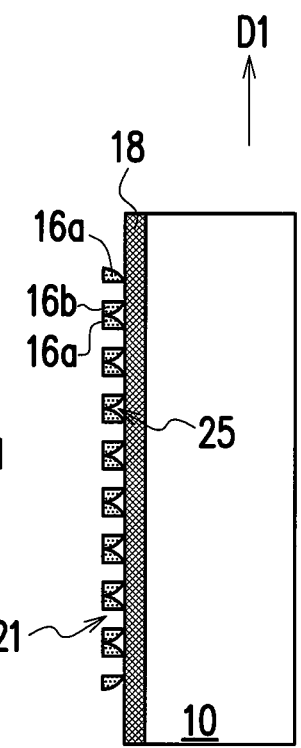
Figure 21B:
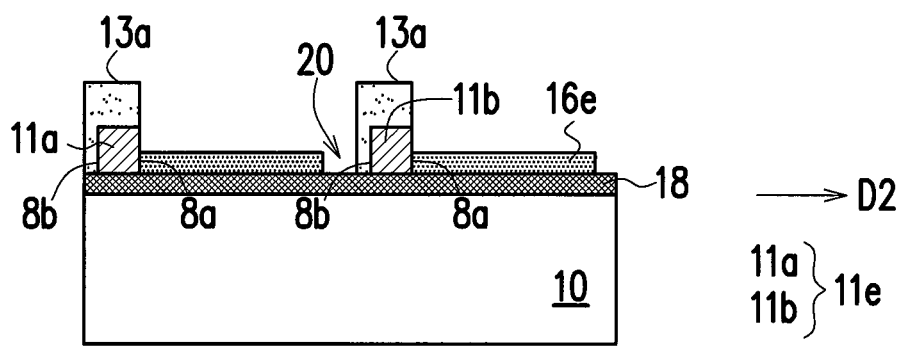
Figure 22A:
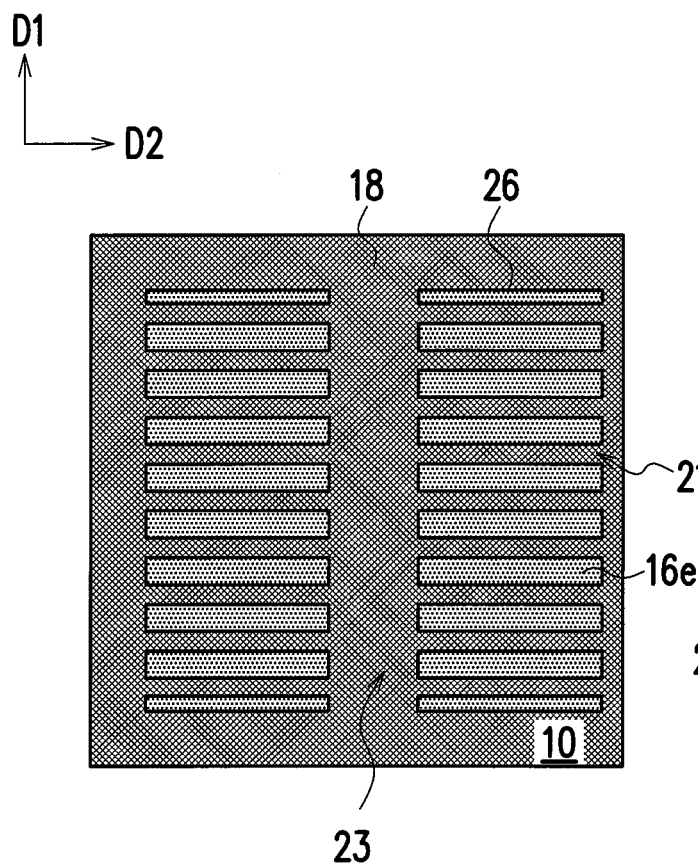
Figure 22C:
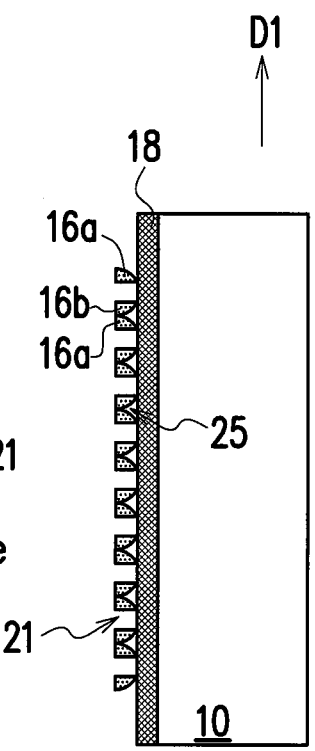
Figure 22B:
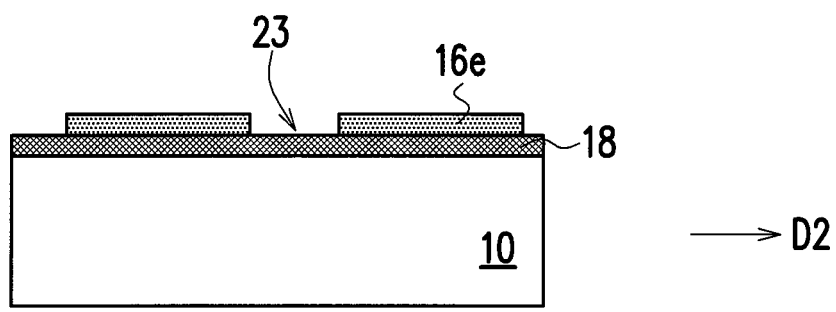

Referring to FIG. 20A to FIG. 20C, as provided in the first embodiment of the invention, the carbon layer 15 including a plurality of hollow carbon tubes 16 is formed on the first sides 8a of the first catalyst pattern 11a and the second catalyst pattern 11b. In some embodiments, the carbon layer 15 is connected to the first side 8a of the first catalyst pattern 11a and is separated from the second side 8b of the second catalyst pattern 11b by a space 20. In some other embodiments, the carbon layer 15 is connected to the second side 8b of the second catalyst pattern 11b, and no space exists between the carbon layer 15 and the second side 8b of the second catalyst pattern 11b.

Referring to FIG. 21A to FIG. 21C and FIG. 22A to FIG. 22C, a top 16d and a portion 16c of a bottom of each of the hollow carbon tubes 16 closest to the substrate 10 are removed, such that a plurality of remnants 16a and/or 16b are left, and that a stripe pattern 16e is formed. A plurality of the stripe patterns 16e constitute a mask layer 26. An opening 21 exists between two remnants 16a and 16b left in the same hollow carbon tube 16. The patterned passivation layer 13a and the patterned catalyst layer 11e are then removed to form an opening 23 between two adjacent columns of remnants 16a/16b. In other words, the mask layer 26 has the opening 21 and the opening 23 that expose a portion of the hard mask layer 18. An annealing process is then performed on the mask layer 15 to enhance properties of the mask layer 26.

Figures 23A, 23C:
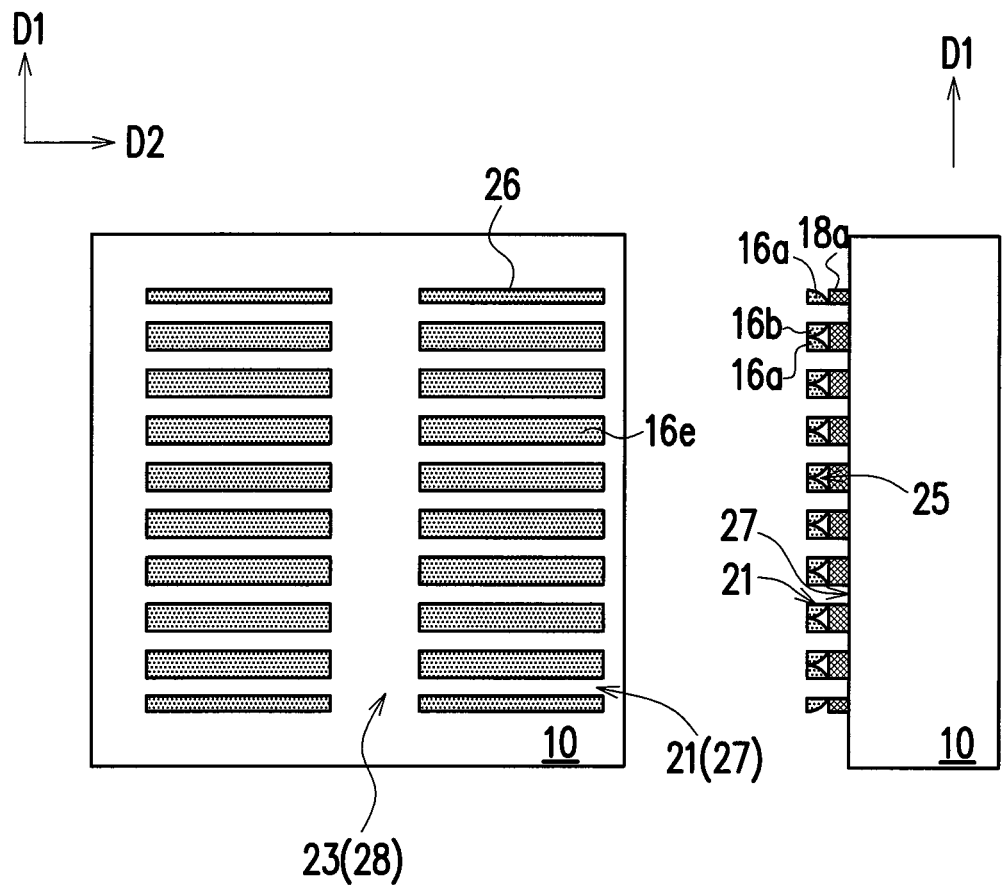
Figure 23B:
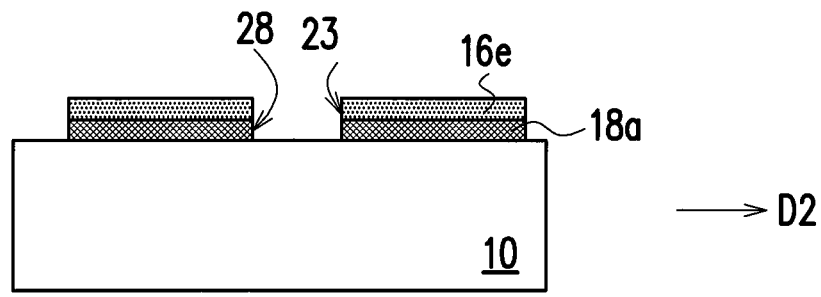
Figures 24A, 24C:
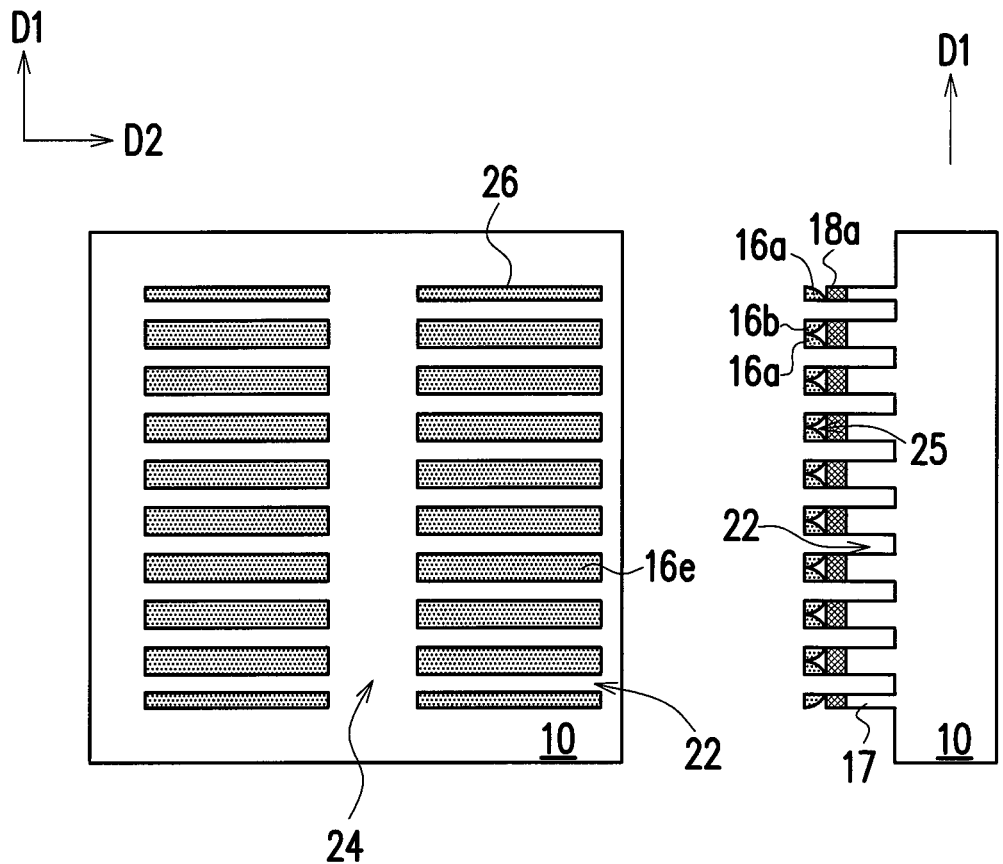
Figure 24B:
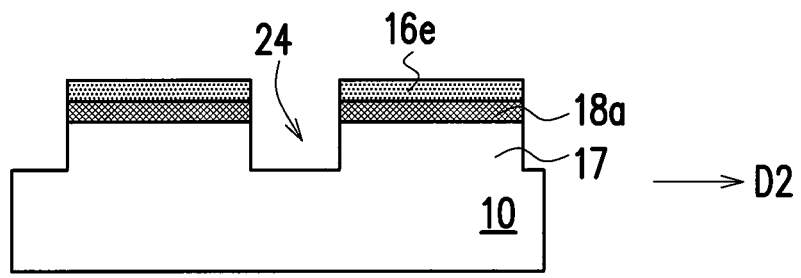

Referring to FIG. 23A to FIG. 23C, the portion of the hard mask layer 18 exposed by the opening 21 and the opening 23 is removed to form a patterned hard mask layer 18a. A method of said removal is, for example, an etching process. The etching process includes an anisotropic etching process. The patterned hard mask layer 18a has an opening 27 and an opening 28 that expose a portion of the substrate 10. The opening 27 and the opening 28 respectively correspond to the opening 21 and the opening 23.

Referring to FIG. 24A to FIG. 24C and FIG. 25A to FIG. 25C, the portion of the substrate 10 exposed by the opening 27 and the opening 28 is removed by using the mask layer 26 and the patterned hard mask layer 18a as a mask to respectively form trenches 22 and 24. A fin structure 17 is formed on the substrate 10 located between two adjacent trenches 22 in the same column. Two adjacent columns of fin structures 17 are separated by the trench 24. The mask layer 26 and the hard mask layer 18 are then removed. A method of said removal is, for example, an etching process, e.g., an isotropic etching process or an anisotropic etching process.

Figure 34A:
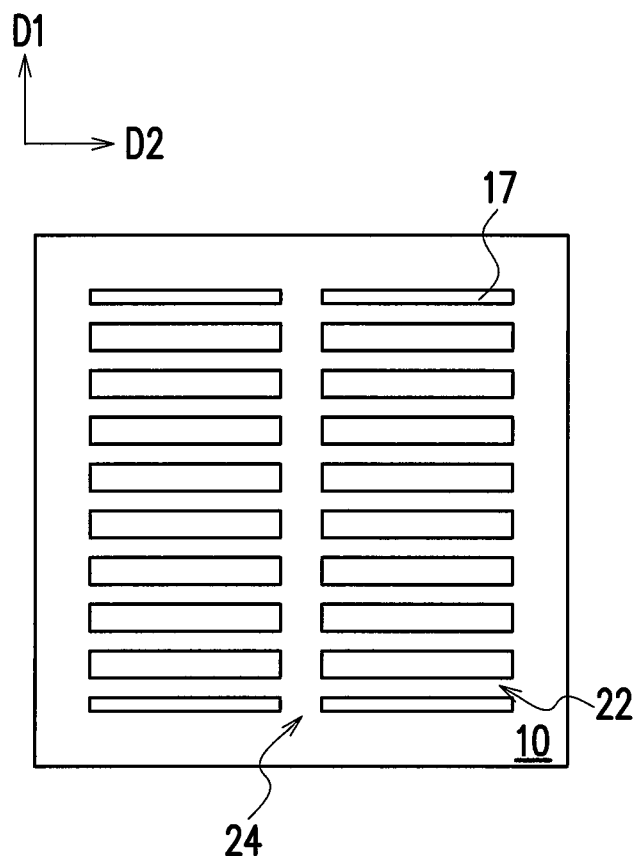
Figure 34C:
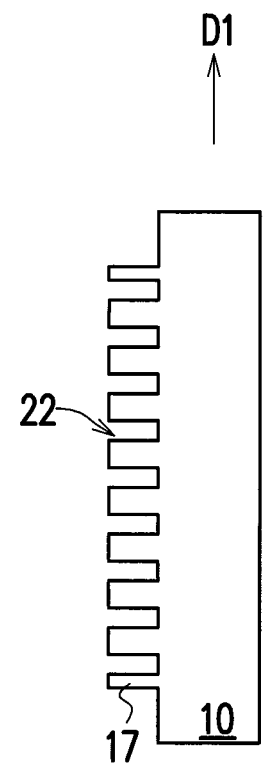
Figure 34B:
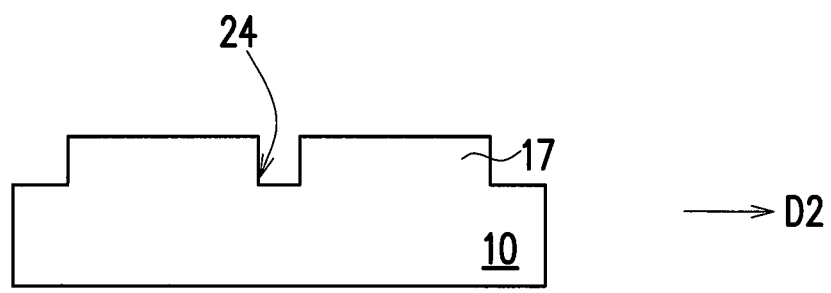

FIG. 26 to FIG. 28 and FIGS. 29A/29B/29C to FIGS. 34A/34B/34C are schematic flow charts of a method of fabricating a fin structure according to a fourth embodiment of the invention. This embodiment is similar to the second embodiment of the invention. A difference between this embodiment and the second embodiment lies in that a hard mask layer 18 is formed before a catalyst layer 11 is formed in this embodiment. Sequential processes are performed afterwards, and detailed descriptions are as follows.

Figure 26:
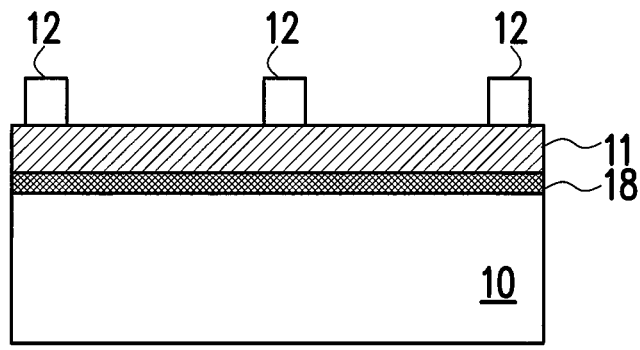
Figure 27:
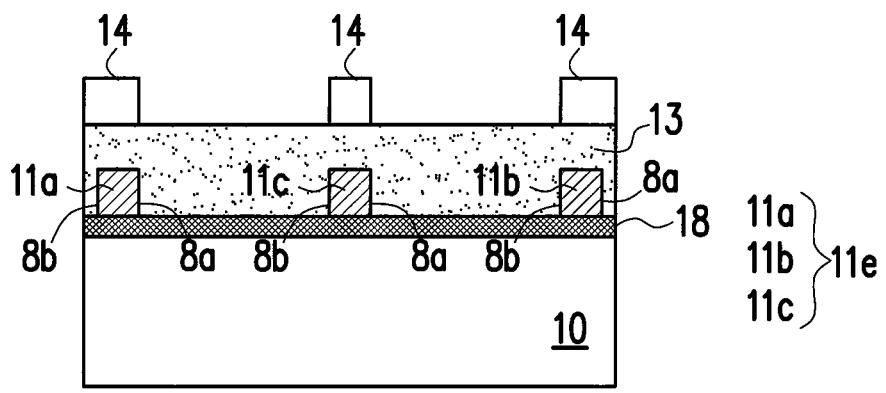

Referring to FIG. 26 and FIG. 27, the hard mask layer 18, the catalyst layer 11, and the patterned mask layer 12 are sequentially formed on the substrate 10. The catalyst layer 11 is patterned by using the patterned mask layer 12 as a mask to form a patterned catalyst layer 11e. The patterned catalyst layer 11e includes a first catalyst pattern 11a, a second catalyst pattern 11b, and a third catalyst pattern 11c. The patterned mask layer 12 is then removed.

Figure 28:
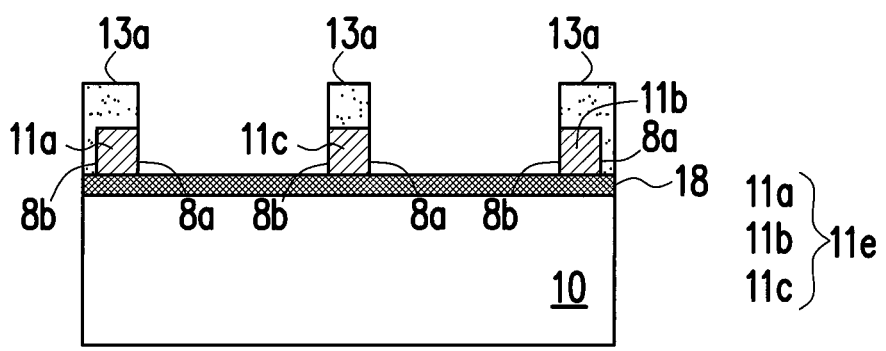

Referring to FIG. 27 and FIG. 28, a passivation layer 13 and a patterned mask layer 14 are formed. The passivation layer 13 is patterned by using the patterned mask layer 14 as a mask to form a patterned passivation layer 13a. The patterned mask layer 14 is then removed.

Referring to FIG. 28, as provided in the second embodiment of the invention, the patterned passivation layer 13a covers the surface of the patterned catalyst layer 11e. The patterned passivation layer 13a also covers the second side 8b of the first catalyst pattern 11a and the first side 8a of the second catalyst pattern 11b. The first side 8a of the first catalyst pattern 11a, the second side 8b of the second catalyst pattern 11b, and the first side 8a and the second side 8b of the third catalyst pattern 11c are exposed.

Figure 29A:
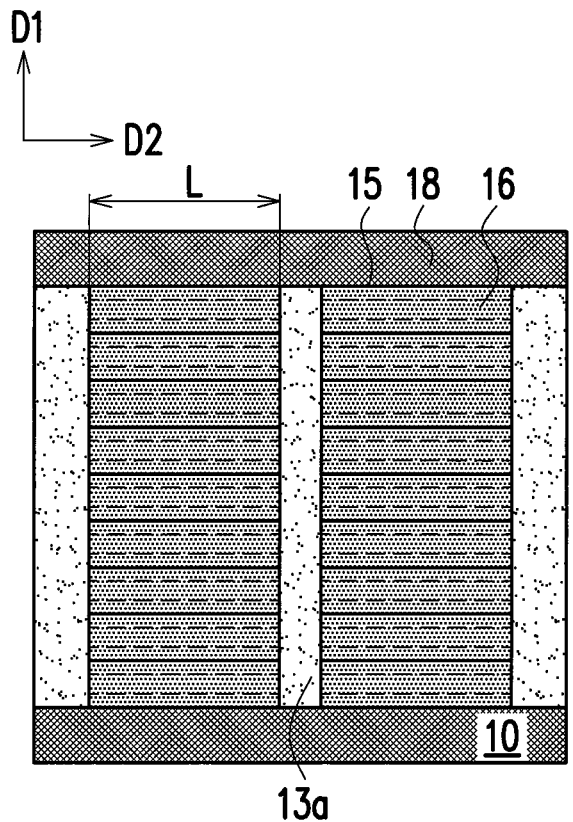
Figure 29C:
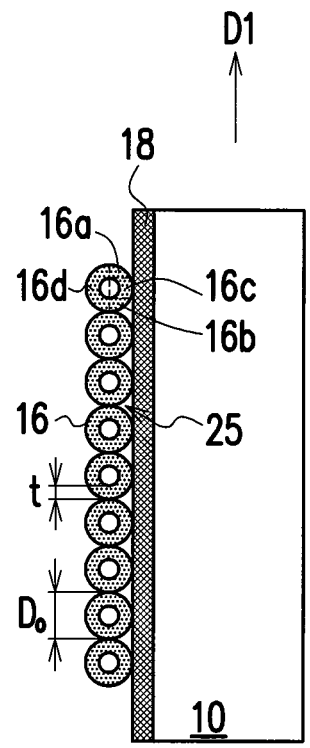
Figure 29B:
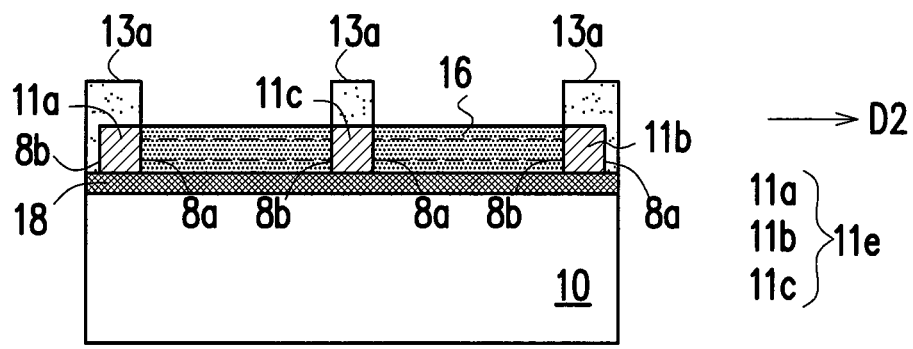

Referring to FIG. 29A to FIG. 29C, a carbon layer 15 is formed between the first catalyst pattern 11a and the third catalyst pattern 11c and between the second catalyst pattern 11b and the third catalyst pattern 11c. The carbon layer 15 includes a plurality of hollow carbon tubes 16.

Figure 30A:
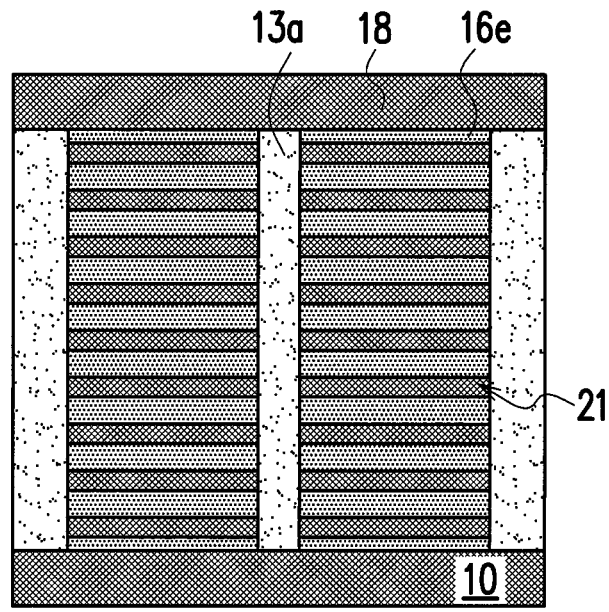
Figure 30C:
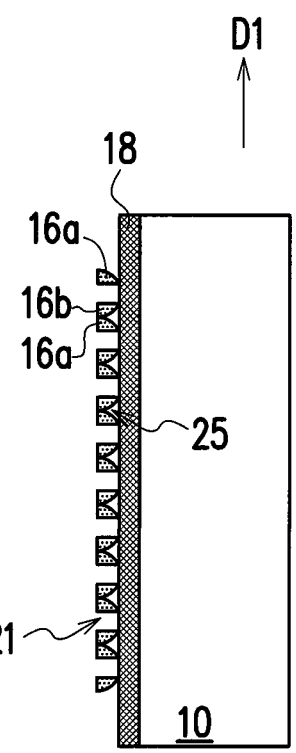
Figure 30B:
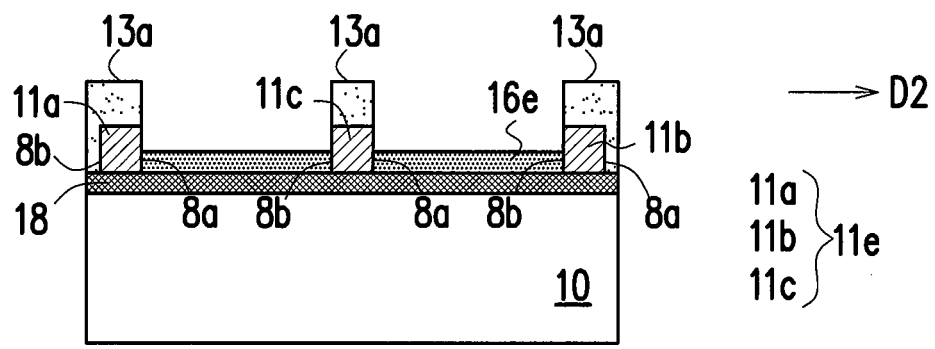

Referring to FIG. 30A to FIG. 30C, a top 16d and a portion 16c of a bottom of each of the hollow carbon tubes 16 closest to the substrate 10 are removed, such that a plurality of remnants 16a and/or 16b are left, and that a stripe pattern 16e is formed. A plurality of the stripe patterns 16e constitute a mask layer 26. An opening 21 exists between two remnants 16a and 16b left in the same hollow carbon tube 16.

Referring to FIG. 31A to FIG. 31C, the patterned passivation layer 13a and the patterned catalyst layer 11e are removed to form an opening 23 between two adjacent rows of remnants 16a/16b. In other words, the mask layer 26 has the opening 21 and the opening 23 that expose a portion of the hard mask layer 18. An annealing process is then performed to the mask layer 26.

Figure 32A:
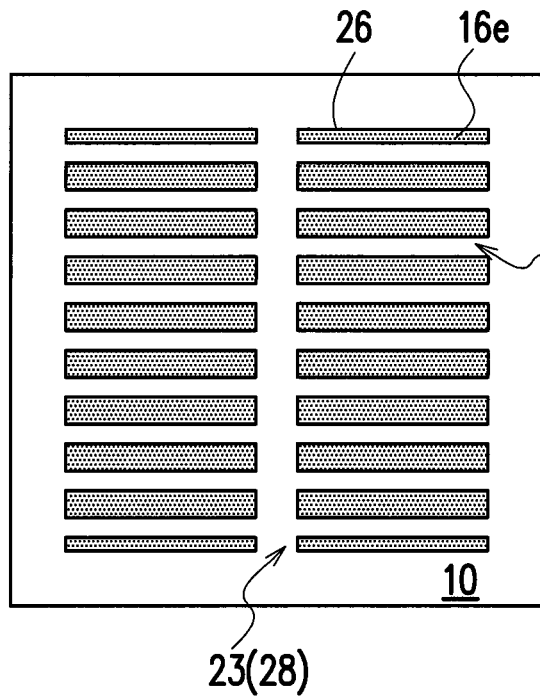
Figure 32C:
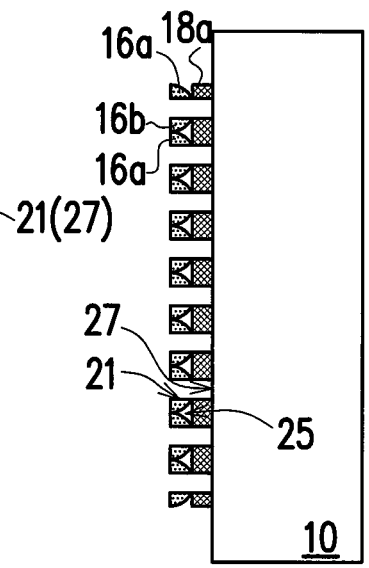
Figure 32B:
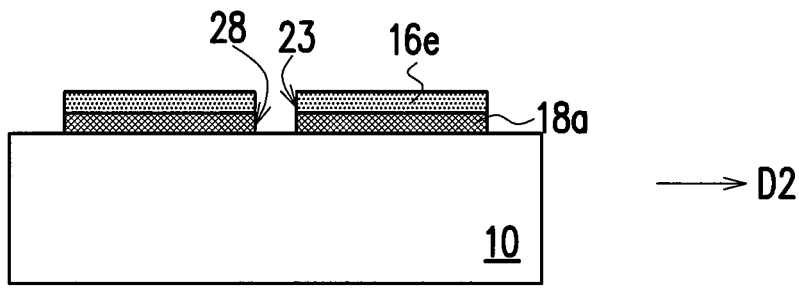
Figures 33A, 33C:
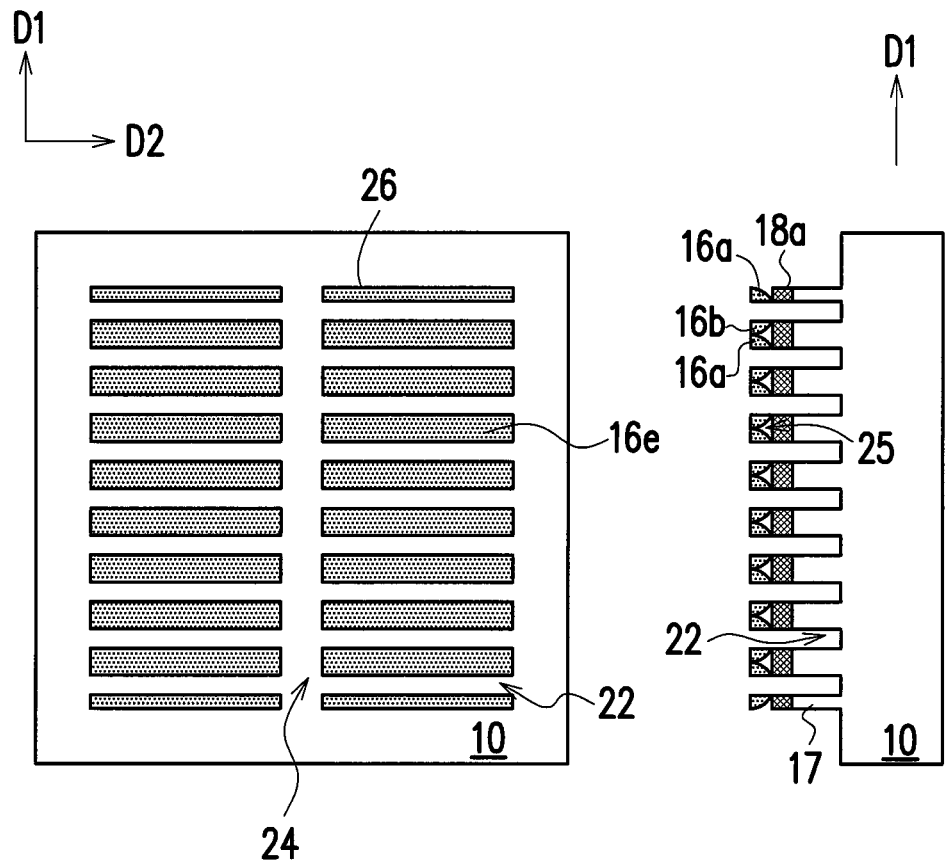
Figure 33B:
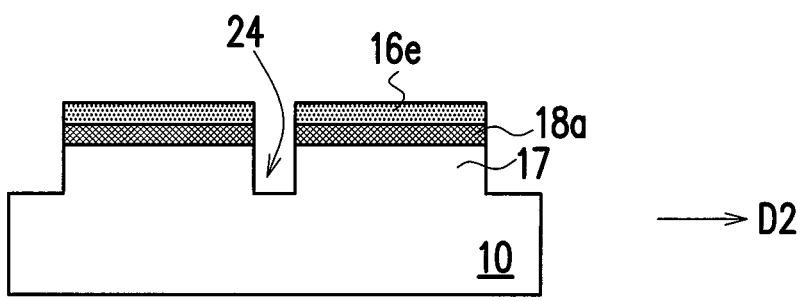

Referring to FIG. 32A to FIG. 32C, a portion of the hard mask layer 18 exposed by the opening 21 and the opening 23 is removed to form a patterned hard mask layer 18a. The patterned hard mask layer 18a has an opening 27 and an opening 28 that expose a portion of the substrate 10. The opening 27 and the opening 28 respectively correspond to the opening 21 and the opening 23.

Referring to FIG. 33A to FIG. 33C and FIG. 34A to FIG. 34C, the portion of the substrate 10 exposed by the opening 27 and the opening 28 is removed by using the mask layer 26 and the patterned hard mask layer 18 as a mask, so as to respectively form trenches 22 and 24. A fin structure 17 is formed on the substrate 10 located between two adjacent trenches 22 in the same column. The fin structures 17 in two adjacent columns are separated by the trench 24. The mask layer 26 and the hard mask layer 18 are then removed.

To sum up, according to the method of fabricating the fin structure provided herein, while the fin structure is being fabricated, the remnants formed by the hollow carbon tubes serve as the mask layer, or the remnants and the underlying the patterned hard mask layer together act as a mask. Thereby, the dimensional accuracy of the fin structures may be improved, and the fin structures with smaller spaces may be obtained.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:
1. A method of fabricating a fin structure, comprising:
   forming a patterned catalyst layer and a patterned passivation layer on a substrate, the patterned catalyst layer and the patterned passivation layer extending along a first direction, wherein the patterned passivation layer is located on the patterned catalyst layer;

forming a carbon layer on at least one side of the patterned catalyst layer, wherein the carbon layer comprises a plurality of hollow carbon tubes arranged along the first direction, and each of the hollow carbon tubes extends along a second direction;

performing a removal process to remove a top of each of the hollow carbon tubes and a portion of a bottom of each of the hollow carbon tubes closest to the substrate, such that a plurality of remnants are left and serve as a mask layer, wherein two adjacent remnants of the remnants form a stripe pattern extending along the second direction;

removing the patterned passivation layer and the patterned catalyst layer;

transferring a pattern of the mask layer to the substrate to form a plurality of fin structures; and removing the mask layer.

2. The method according to claim 1, wherein the patterned catalyst layer comprises a first catalyst pattern and a second catalyst pattern, and the carbon layer is formed between the first catalyst pattern and the second catalyst pattern.

3. The method according to claim 1, wherein the patterned passivation layer further covers a second side of the first catalyst pattern and a second side of the second catalyst pattern, such that the hollow carbon tubes grow along the second direction from a first side of the first catalyst pattern to the second side of the second catalyst pattern.

4. The method according to claim 2, wherein the patterned catalyst layer further comprises a third catalyst pattern located between the first catalyst pattern and the second catalyst pattern;

wherein the patterned passivation layer further covers the second side of the first catalyst pattern and a first side of the second catalyst pattern.

5. The method of according to claim 4, wherein the hollow carbon tubes are connected by growing along the second direction from the first side of the first catalyst pattern and growing along a negative second direction from a second side of the third catalyst pattern, and connected by growing along the second direction from a first side of the third catalyst pattern and growing along the negative second direction from the second side of the second catalyst pattern.

6. The method according to claim 1, further comprising forming a hard mask layer on the substrate before the patterned catalyst layer is formed.

7. The method according to claim 6, further comprising:
patterning the hard mask layer using the mask layer as a mask before the pattern of the mask layer is transferred to the substrate to form a patterned hard mask layer; and
removing the patterned hard mask layer after the fin structures are formed.

8. The method according to claim 7, wherein a material of the patterned hard mask layer is different from a material of the patterned passivation layer.

9. The method according to claim 8, wherein a method of removing the patterned passivation layer comprises performing an isotropic etching process, an anisotropic etching process, or a combination thereof.

10. The method according to claim 6, wherein the hard mask layer comprises a conductive material, a dielectric material, or a combination thereof.

11. The method according to claim 10, wherein the hard mask layer comprises platinum, silicon oxide, silicon nitride, titanium oxide, aluminum oxide, copper oxide, silicon oxynitride, silicon carbonitride, or silicon oxycarbonitride.

12. The method according to claim 1, wherein the patterned passivation layer comprises a conductive material, a dielectric material, or a combination thereof.

13. The method o according to claim 12, wherein the patterned passivation layer comprises platinum, silicon oxide, silicon nitride, silicon oxynitride, silicon carbonitride, or silicon oxycarbonitride.

14. The method according to claim 1, wherein the patterned catalyst layer comprises metal or a metal alloy.

15. The method according to claim 14, wherein the patterned catalyst layer comprises iron, cobalt, nickel, copper, or an alloy thereof.

16. The method according to claim 1, further comprising performing an annealing process to the mask layer after the patterned passivation layer and the patterned catalyst layer are removed but before the pattern of the mask layer is transferred to the substrate.

* * * * *